United States Patent
Cho et al.

(10) Patent No.: US 8,796,645 B2
(45) Date of Patent: Aug. 5, 2014

(54) EXPOSURE APPARATUS FOR PHOTOALIGNMENT PROCESS AND METHOD FOR MANUFACTURING LIQUID CRYSTAL DISPLAY

(75) Inventors: Soo-Ryun Cho, Gunpo-si (KR); Jun Woo Lee, Seongnam-si (KR); Kyoung Tae Kim, Osan-si (KR); Joo Seok Yeom, Seoul (KR); Suk Hoon Kang, Seoul (KR); Eun Ju Kim, Suwon-si (KR)

(73) Assignee: Samsung Display Co., Ltd. (KR)

( * ) Notice: Subject to any disclaimer, the term of this patent is extended or adjusted under 35 U.S.C. 154(b) by 298 days.

(21) Appl. No.: 13/241,376

(22) Filed: Sep. 23, 2011

(65) Prior Publication Data

US 2012/0308936 A1     Dec. 6, 2012

(30) Foreign Application Priority Data

Jun. 3, 2011  (KR) ................ 10-2011-0053971

(51) Int. Cl.
*G01N 23/00* (2006.01)
*G03F 1/00* (2012.01)

(52) U.S. Cl.
USPC ............ 250/491.1; 250/492.2; 250/492.22; 430/319; 430/22; 430/5

(58) Field of Classification Search
CPC ..................................................... G01N 23/00
USPC ........................................ 250/491.1; 430/319
See application file for complete search history.

(56) References Cited

U.S. PATENT DOCUMENTS

| 7,279,257 | B2 * | 10/2007 | Takizawa ............... 430/22 |
| 7,926,000 | B2 * | 4/2011 | Tan et al. ............... 716/55 |
| 8,316,326 | B1 * | 11/2012 | Pierrat .................. 716/50 |
| 2010/0118246 | A1 | 5/2010 | Nakagawa | |

FOREIGN PATENT DOCUMENTS

| JP | 2004302439 | | 10/2004 | |
| JP | 2007057791 | A * | 3/2007 | ........... G03F 7/20 |
| JP | 2009080312 | | 4/2009 | |
| JP | 2010117734 | | 5/2010 | |
| KR | 1020010037225 | | 5/2001 | |
| KR | 1020080000738 | | 1/2008 | |
| KR | 100911459 | | 8/2009 | |

* cited by examiner

*Primary Examiner* — Phillip A Johnston
(74) *Attorney, Agent, or Firm* — Cantor Colburn LLP

(57) ABSTRACT

An exposure apparatus for a photoalignment process includes; a first photomask including a plurality of transmission parts; and a second photomask including a plurality of transmission parts, where the first photomask and the second photomask partially overlap each other such that each of the first photomask and the second photomask includes an overlapping region and a non-overlapping region, the overlapping region of at least one of the first photomask and the overlapping region of the second photomask includes at least two subregions, and shapes or arrangements of the transmission parts in the at least two subregions are different from each other.

21 Claims, 29 Drawing Sheets

First exposing → Second exposing

US 8,796,645 B2

EXPOSURE APPARATUS FOR PHOTOALIGNMENT PROCESS AND METHOD FOR MANUFACTURING LIQUID CRYSTAL DISPLAY

This application claims priority to Korean Patent Application No. 10-2011-0053971, filed on Jun. 3, 2011, and all the benefits accruing therefrom under 35 U.S.C. §119, the content of which in its entirety is herein incorporated by reference.

BACKGROUND OF THE INVENTION (a) Field of the Invention

Exemplary embodiments of the invention relate to an exposure apparatus for a photoalignment process and a method for manufacturing a liquid crystal display.

(b) Description of the Related Art

A liquid crystal display, which is one of the most widely used types of flat panel display, typically includes upper and lower display panels with field generating electrodes such as a pixel electrode and a common electrode, etc. provided thereon, and a liquid crystal layer interposed therebetween. The liquid crystal display generates electric fields in the liquid crystal layer by applying voltages to the field generating electrodes and determines directions of liquid crystal molecules of the liquid crystal layer by the generated electric field, and the polarization of incident light is thereby controlled to display images.

Among the liquid crystal displays, the vertical alignment ("VA") mode liquid crystal display, in which longitudinal axes of liquid crystal molecules are aligned vertically with respect to the upper and lower display panels when electric fields are not generated, has been widely researched due to a large contrast ratio and a wide standard viewing angle.

The VA mode liquid crystal display may form a plurality of domains, in a unit pixel, in which alignment directions of liquid crystals are different from each other, to implement a wide viewing angle. As described above, a photoalignment process for controlling an alignment direction and an alignment angle of the liquid crystal molecules by irradiating light, such as ultraviolet rays, to an alignment layer including a photoreaction material to form a plurality of domains in the unit pixel is being developed.

BRIEF SUMMARY OF THE INVENTION

Exemplary embodiments of the invention provide an exposure apparatus using at least two photomasks in a photoalignment process of a liquid crystal display and a method for manufacturing a liquid crystal display using the exposure apparatus.

An exemplary embodiment of the invention provides an exposure apparatus for a photoalignment process, where the exposure apparatus includes; a first photomask including a plurality of transmission parts; and a second photomask including a plurality of transmission parts, where the first photomask and the second photomask partially overlap each other such that each of the first photomask and the second photomask includes an overlapping region and a non-overlapping region, the overlapping region of at least one of the first photomask and the overlapping region of the second photomask includes at least two subregions, and shapes or arrangements of the transmission parts in the at least two subregions are different from each other.

In an exemplary embodiment, the at least two subregions may include at least one first subregion and at least one second region, an irradiation region corresponding to the transmission parts in the at least one first subregion of the first photomask and an irradiation region corresponding to the transmission parts in the at least one first subregion of the second photomask may overlap each other, and irradiation regions corresponding to the transmission parts in the at least one second subregion of the first photomask and irradiation regions corresponding to the transmission parts in the at least one second subregion of the second photomask may not overlap each other.

In an exemplary embodiment, the at least one first subregion and the at least one second subregion may be alternately arranged.

In an exemplary embodiment, a sum of an area of one transmission part of the first photomask and an area of one transmission part of the second photomask may be substantially equal to or greater than an area of one transmission part in the non-overlapping region of the first photomask or the second photomask.

In an exemplary embodiment, a sum of the area of the one transmission part of the first photomask and the area of the one transmission part of the second photomask may be about 100% to about 150% of the area of the one transmission part in the non-overlapping region of the first photomask.

In an exemplary embodiment, the transmission parts of the first photomask may be arranged in a first direction, and a length of the transmission parts in the at least one first subregion of at least one of the first photomask and the second photomask in a second direction, which is perpendicular to the first direction, may be gradually changed along the first direction.

In an exemplary embodiment, the transmission parts in the at least one second subregion of the first photomask and the transmission parts in the at least one second subregion of the second photomask may be alternately arranged in the first direction.

In an exemplary embodiment, the apparatus may further include a first light source which provides light to the first photomask, and a second light source which provides light to the second photomask.

In an exemplary embodiment, the first light source and the second light source may irradiate light obliquely through the first photomask and the second photomask.

Another exemplary embodiment of the invention provides an exposure apparatus for a photoalignment process, where the exposure apparatus includes: a first photomask including a plurality of transmission parts; and a second photomask including a plurality of transmission parts, where the first photomask and the second photomask partially overlap each other such that each of the first photomask and the second photomask includes an overlapping region and a non-overlapping region, each of the first photomask and the second photomask include a first portion and a second portion, and irradiation regions corresponding to the first portion are different from irradiation regions corresponding to the second portion, an irradiation direction of lights passing through a transmission part in the first portion is different from an irradiation direction of lights passing through a transmission part in the second portion, and a shape or an arrangement of the transmission parts in the overlapping region of the first photomask or the second photomask is different from a shape or an arrangement of the transmission parts in the non-overlapping region of the first photomask or the second photomask.

In an exemplary embodiment, an irradiation region corresponding to one transmission part in the overlapping region of the first photomask and an irradiation region corresponding to one transmission part in the overlapping region of the second photomask may overlap each other.

In an exemplary embodiment, irradiation regions corresponding to a portion of the transmission parts in the overlapping region of the first photomask and irradiation regions corresponding to a portion of the transmission parts in the overlapping region of the second photomask may not overlap.

In an exemplary embodiment, the overlapping region may include at least two subregions, and shapes or arrangements of the transmission parts in the at least two subregions are different from each other.

Yet another exemplary embodiment of the invention provides an exposure apparatus for a photoalignment process, where the exposure apparatus includes: a first photomask including a plurality of transmission parts arranged in a first direction; and a second photomask including a plurality of transmission parts arranged in the first direction, where the first photomask and the second photomask partially overlap each other such that each of the first photomask and the second photomask includes an overlapping region and a non-overlapping region, a transmission part of at least one of the first photomask and the second photomask is asymmetric with respect to the first direction, and a shape or an arrangement of the transmission parts in the overlapping region of the first photomask or the second photomask is different a shape or an arrangement of the transmission parts in the non-overlapping region of the first photomask or the second photomask.

In an exemplary embodiment, irradiation regions corresponding to a portion of the transmission parts in the overlapping region of the first photomask and irradiation regions corresponding to a portion of the transmission parts in the overlapping region of the second photomask may not overlap.

In an exemplary embodiment, a combined shape of one transmission part in the overlapping region of the first photomask and one transmission part in the overlapping region of the second photomask may be substantially identical to a shape of one transmission part in the non-overlapping region of the first photomask or the second photomask.

In an exemplary embodiment, the overlapping region of at least one of the first photomask and the overlapping region of the second photomask may include at least two subregions, and shapes or arrangements of the transmission parts in the at least two subregions are different from each other.

Still another exemplary embodiment of the invention provides a method for manufacturing a liquid crystal display, where the method includes: preparing a first substrate and a second substrate; coating an alignment layer including a photoreactive alignment material on at least one of the first substrate and the second substrate; and irradiating light to the alignment layer through the first and the second photomasks of the exposure apparatus.

Still yet another exemplary embodiment of the invention provides a method for manufacturing a liquid crystal display, where the method includes: preparing a first substrate and a second substrate; coating an alignment layer including a photoreactive alignment material on at least one of the first substrate and the second substrate; exposing an entire surface of the alignment layer; and irradiating light to the exposed surface of the alignment layer through a first photomask and a second photomask, where the first photomask and the second photomask partially overlap each other such that each of the first photomask and the second photomask includes an overlapping region and a non-overlapping region, and in a shape or an arrangement of the transmission parts in the overlapping region of the first photomask or the second photomask is different a shape or an arrangement of the transmission parts in the non-overlapping region of the first photomask or the second photomask.

In an exemplary embodiment, an irradiation region corresponding to one transmission part of the first photomask and an irradiation region corresponding to one transmission part of the second photomask may overlap.

In an exemplary embodiment, a sum of an area of the one transmission part in the overlapping region of the first photomask and an area of the one transmission part in the overlapping region of the second photomask may be substantially equal to or greater than an area of one transmission part in the non-overlapping region of the first photomask or the second photomask.

In an exemplary embodiment, the overlapping region may include at least two subregions, and shapes or arrangements of the transmission parts in the at least two subregions are different from each other.

In an exemplary embodiment, the at least two subregions may include at least one first subregion and at least one second subregion, an irradiation region corresponding to the transmission parts in the at least one first subregion of the first photomask and an irradiation region corresponding to the transmission parts in the at least one first subregion of the second photomask may overlap each other, and irradiation regions corresponding to the transmission parts in the at least one second subregion of the first photomask and irradiation regions corresponding to the transmission parts in the at least one second subregion of the second photomask may not overlap each other.

In an exemplary embodiment of a photoalignment process of a liquid crystal display, two or more photomasks having transmission parts with various shapes and arrangements overlap each other in a region, and the occurrence of a boundary line between exposure regions of different photomasks and display defects thereby substantially decrease. In such an embodiment, an arrangement margin of the photomask is substantially increased while a manufacturing cost of the photomask is substantially decreased.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION OF THE EMBODIMENTS

Figure 1:
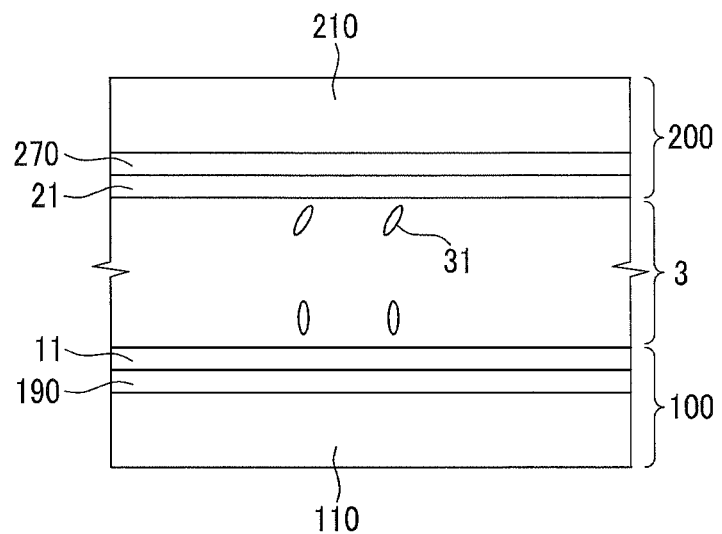
FIG. 1 is a cross-sectional view of an exemplary embodiment of a liquid crystal display according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be explained in detail with reference to the accompanying drawings.

First, an exemplary embodiment of a liquid crystal display according to the invention will be described with reference to FIG. 1.

FIG. 1 is a cross-sectional view of an exemplary embodiment of a liquid crystal display according to the invention.

Referring to FIG. 1, an exemplary embodiment of a liquid crystal display is a vertical alignment ("VA") mode liquid crystal display, and includes a lower panel 100 and an upper panel 200 opposite to, e.g., facing, each other, and a liquid crystal layer 3 interposed between the lower and upper panels 100 and 200.

The lower panel 100 includes a lower insulation substrate 110, a plurality of signal lines (not shown) disposed on the lower insulation substrate 110, a switching element (not shown) e.g., a thin film transistor, connected to the signal lines thereon, and a plurality of pixel electrodes 190 connected to the switching element thereon. A first alignment layer 11 is disposed, e.g., coated, on the pixel electrodes 190.

The upper panel 200 includes an upper insulation substrate 210 and a counter electrode 270 facing the pixel electrode 190 and disposed on the upper insulation substrate 210. A second alignment layer 21 is disposed, e.g., coated, on the counter electrode 270.

In an exemplary embodiment, the first and second alignment layers 11 and 21 are a vertical alignment layer, and include a photoreactive alignment material that reacts with light such as ultraviolet rays, for example. The photoreactive alignment material has alignment strength, such that liquid crystal molecules 31 vertically aligned with respect to surfaces of the lower and upper insulation substrates 110 and 210 are tilted at a predetermined azimuth, that is, at a pretilt angle, with respect to a normal line of the surfaces of the lower and upper insulation substrates 110 and 210. The alignment strength of the lower and upper insulation alignment layers 11 and 21 may be based on azimuthal anchoring energy between the liquid crystal molecule 31 and the surfaces of the first and second alignment layers 11 and 21. The direction of the alignment strength of the first and second alignment layers 11 and 21 or the alignment direction of the liquid crystal molecule 31 thereby depends on factors such as an irradiation direction of light with respect to the first and second alignment layers 11 and 21, for example, and the pretilt angle of the liquid crystal molecule by the alignment strength may depend on various factors such as exposure energy and an irradiation slope of light, for example. The first and second alignment layers 11 and 21 may be implemented by reactions such as photoisomerization, photodecomposition, photocuring and photopolymerization of the photoreactive alignment material, for example.

The liquid crystal molecule 31 of the liquid crystal layer 3 has dielectric anisotropicity, and is aligned substantially in a vertical direction with respect to the surfaces of the lower and upper insulation substrates 110 and 210, but the liquid crystal molecule 31 disposed substantially close to, e.g., contacting, the surfaces of the first and second alignment layers 11 and 21 is tilted at a predetermined pretilt angle with respect to a normal lines of the surfaces of the lower and upper insulation substrates 110 and 210 based on the alignment strength of the first and second alignment layers 11 and 21 to the photoreactive alignment material. The liquid crystal molecule 31 disposed substantially spaced apart from the surfaces of the lower and upper insulation substrates 110 and 210 may be aligned at the pretilt angle in a direction by the alignment strength of one of the first and second alignment layers 11 and 21 that is closer thereto. The liquid crystal molecule 31 disposed at an intermediate portion of the liquid crystal layer 3 may be tilted at a pretilt angle in an intermediate direction of two alignment directions of the liquid crystal molecules 31 substantially close to the lower and upper panels 100 and 200.

In an exemplary embodiment, the liquid crystal display includes a plurality of pixels PX that are a unit for displaying an image, and in the case of the VA mode liquid crystal display, a plurality of domains in which the alignment directions of the liquid crystal molecules 31 are different from each other may be formed in a unit pixel PX, to implement a wide viewing angle.

Hereinafter, an exemplary embodiment of a method for manufacturing the liquid crystal display according to the invention will be described.

A plurality of thin films are laminated on the lower insulation substrate 110, and a pixel electrode 190 is provided, e.g., formed. Next, the first alignment layer 11 is completed by a photoalignment process in which the photoreactive alignment material is provided, e.g., coated, on the pixel electrode 190, and light such as ultraviolet rays is irradiated. Similarly, the second alignment layer 21 is completed by a photoalignment process in which a counter electrode 270 is formed on the upper insulation substrate 210, the photoreactive alignment material is provided, e.g., coated, thereon, and light such as ultraviolet rays is irradiated. Next, the liquid crystal layer 3 is provided, e.g., formed, by injecting the liquid crystal material between the lower and upper panels 100 and 200.

Hereinafter, an exemplary embodiment of an exposure apparatus used in a photoalignment process according to the invention and an exemplary embodiment of a photoalignment process using the exposure apparatus will be described with reference to FIGS. 2, 3 and 4A to 4D.

Figure 2:
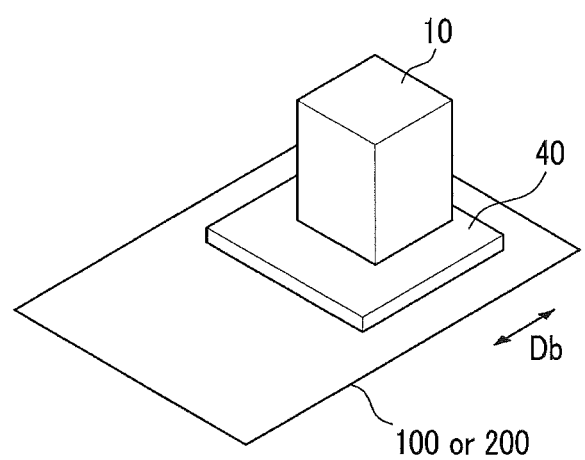
FIG. 2 is a schematic diagram illustrating an exemplary embodiment of an exposure apparatus according the invention.
Figure 3:
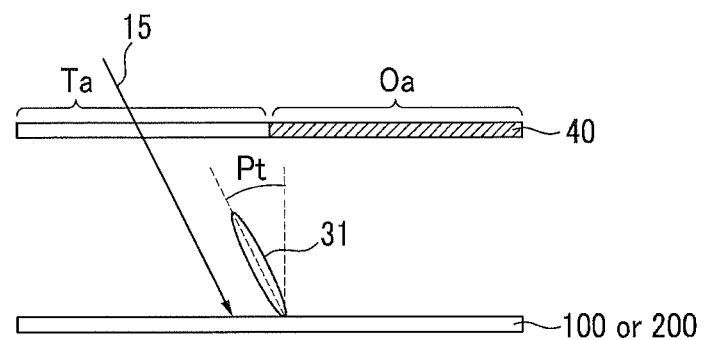
FIG. 3 is a plan view illustrating an exemplary embodiment of a photoalignment process according to the invention.

FIG. 2 is a schematic diagram illustrating an exemplary embodiment of an exposure apparatus according to the invention, FIG. 3 is a plan view illustrating an exemplary embodiment of a photoalignment process according to the invention, and FIGS. 4A to 4D are block diagrams illustrating an alignment direction of an alignment layer in a unit pixel and an alignment direction of the liquid crystal molecules.

Referring to FIG. 2, an exemplary embodiment of the exposure apparatus includes at least one photomask 40 and a light source 10. In an exemplary embodiment, the photomask 40 and the light source 10 are integrated and move together, thus scanning the lower or upper panels 100 or 200 in a second direction Db. In an alternative exemplary embodiment, the photomask 40 and the light source 10 may be fixed, and the lower or upper panels 100 or 200 may move along the second direction Db. The light source 10 may irradiate light such as ultraviolet rays. In an exemplary embodiment, the light may be partially polarized ultraviolet rays or linearly polarized ultraviolet rays, for example.

Referring to FIG. 3, the photomask 40 of an exemplary embodiment of the exposure apparatus includes a transmission part Ta that transmits light and a light blocking part Oa that blocks light transmission. The transmission part Ta and the light blocking part Oa may be alternately disposed. Light 15 emitted from the light source 10 passes through the transmission part Ta of the photomask 40 and the light is irradiated to the photoreactive alignment material of the first and second alignment layers 11 and 21 of the lower and upper panels 100 and 200, thereby inducing a photoreaction such as a photopolymerization reaction. In such an embodiment, when light is obliquely irradiated with respect to the surfaces of the lower or upper panel 100 or 200, the liquid crystal molecules 31 that will be adjacent to the surfaces of the lower or upper panel 100 or 200 may be tilted such that longitudinal axes thereof may form a predetermined azimuth, that is, a predetermined pretilt angle Pt with respect to a normal line to the surfaces of the lower or upper panel 100 or 200.

In an exemplary embodiment, an irradiation direction of light with respect to a unit pixel PX may vary to form a plurality of domains in the unit pixel PX of the liquid crystal display. Hereinafter, an exemplary embodiment of a method of making the irradiation direction various will be described with reference to FIGS. 4A to 4D.

Figure 4A:
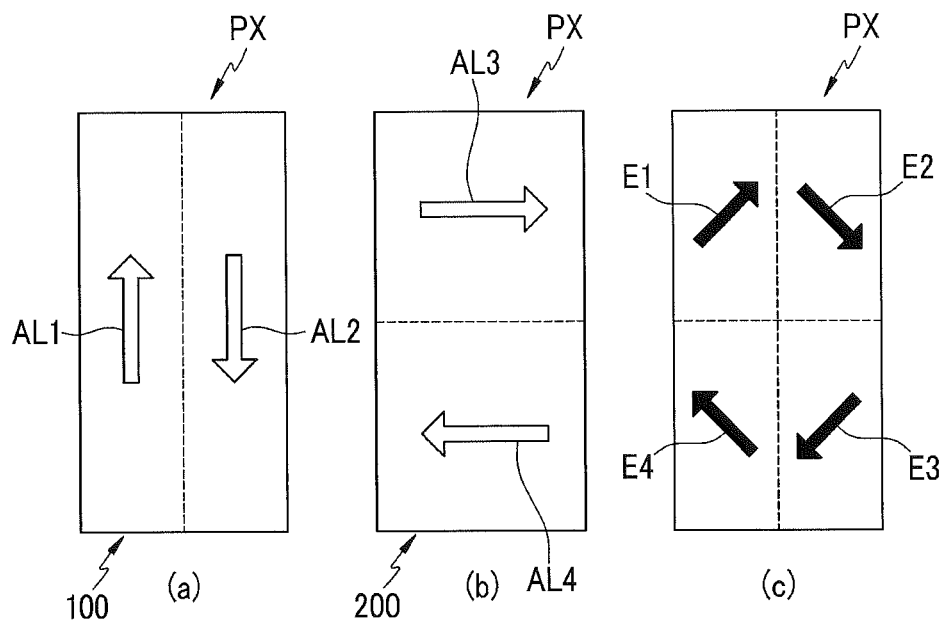
FIGS. 4A to 4D are block diagrams illustrating an alignment direction of an alignment layer in a unit pixel and an alignment direction of the liquid crystal molecules.

First, referring to FIG. 4A(a), the photomask 40 is on the lower panel 100 of the liquid crystal display, and light is obliquely irradiated in a first alignment direction AL1. Then, the pretilt direction of the liquid crystal molecule 31 that is substantially close to the surface of the lower panel 100 becomes the alignment direction AL1 at a left portion of the unit pixel PX. By obliquely irradiating light in a second alignment direction AL2 that is an opposite direction of the first alignment direction AL1 while light is irradiated in the first alignment direction AL1, the liquid crystal molecule 31 that is substantially close to the surface of the lower panel 100 may be pretilted in the second alignment direction AL2 at a right portion of the unit pixel PX.

Similarly, referring to FIG. 4A(b), when the photomask 40 is disposed in the upper panel 200 and light is obliquely irradiated in a third alignment direction AL3 and a fourth alignment direction AL4, which are an opposite to each other, in the unit pixel PX, the pretilt direction of the liquid crystal material 31 that is substantially close to the surface of the upper panel 200 may become the third alignment direction AL3 and the fourth alignment direction AL4.

After the photoalignment process, the lower and upper panels 100 and 200 are connected to each other, the liquid crystal display panel is manufactured by injecting the liquid crystal material, and the liquid crystal material 31, as shown in FIG. 4A(c), may be aligned in four different intermediate alignment directions, e.g., a right upper alignment direction E1, a right lower alignment direction E2, a left lower alignment direction E3 and a left upper alignment direction E4, at an intermediate portion of the liquid crystal layer 3. Accordingly, four different domains may be formed in a unit pixel PX. The four different intermediate alignment directions E1, E2, E3 and E4 illustrated in FIG. 4A(c) may be an average alignment direction of the liquid crystal molecule 31 in an entire thickness direction of the liquid crystal layer 3.

Figure 4B:
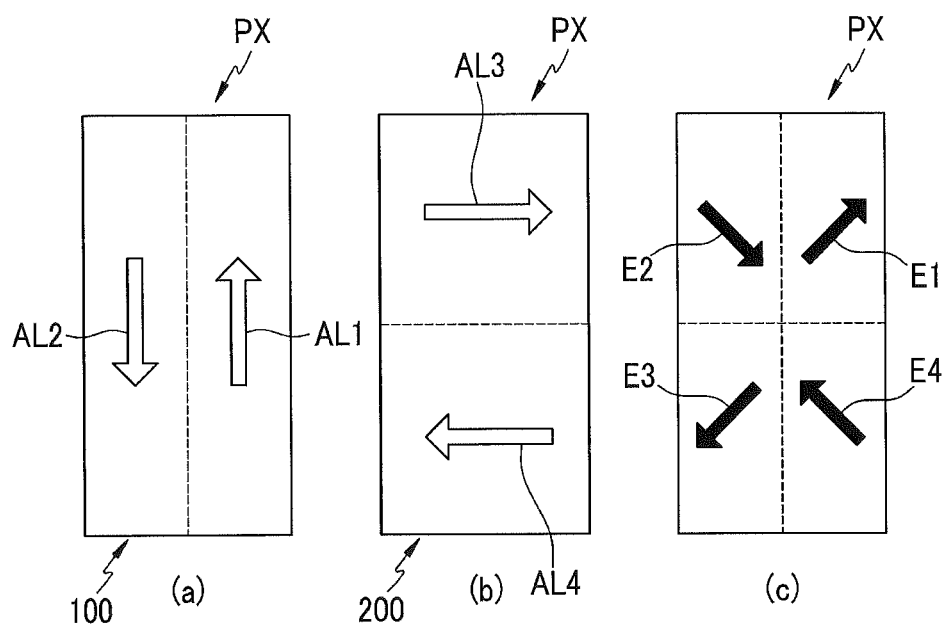

The exemplary embodiment of the photoalignment method illustrated in FIG. 4B is substantially the same as the exemplary embodiment illustrated in FIG. 4A, but an irradiation direction of light to the lower panel 100 may be different from the exemplary embodiment illustrated in FIG. 4A. In one exemplary embodiment, for example, referring to FIG. 4B(a), the pretilt direction of the liquid crystal molecule 31 that is substantially close to the surface of the lower panel 100 becomes the first alignment direction AL1 by irradiating light to the lower panel 100 of the liquid crystal display at a right portion of the unit pixel PX, and the pretilt direction of the liquid crystal molecule 31 that is substantially close to the surface of the lower panel 100 becomes the second alignment direction AL2 by irradiating light to the lower panel 100 of the liquid crystal display at a left portion of the unit pixel PX. Referring to FIG. 4B(b), the pretilt direction of the liquid crystal molecule 31 in the unit pixel PX of the upper panel 200 of the liquid crystal display is substantially the same as the pretilt directions of the liquid crystal molecule 31 in the unit pixel PX of the upper panel 200 in FIG. 4A(b). After the photoalignment process in respect to the lower and upper panels 100 and 200, the lower and upper panels 100 and 200 are combined with each other, the liquid crystal display panel is completed by injecting the liquid crystal material, and the liquid crystal molecules 31 may be aligned as illustrated in FIG. 4B(c) at an intermediate portion of the liquid crystal layer 3. In such an embodiment, the liquid crystal molecule 31 at a right upper part of the unit pixel PX may be pretilted in the right upper alignment direction E1, the liquid crystal molecule 31 at a right lower part of the unit pixel PX may be pretilted in the left upper alignment direction E4, the liquid crystal molecule 31 at a left lower part of the pixel PX may be pretilted in the left lower alignment direction E3, and the liquid crystal molecule 31 at a left upper part of the unit pixel PX may be pretilted in the right lower alignment direction E2.

Figure 4C:
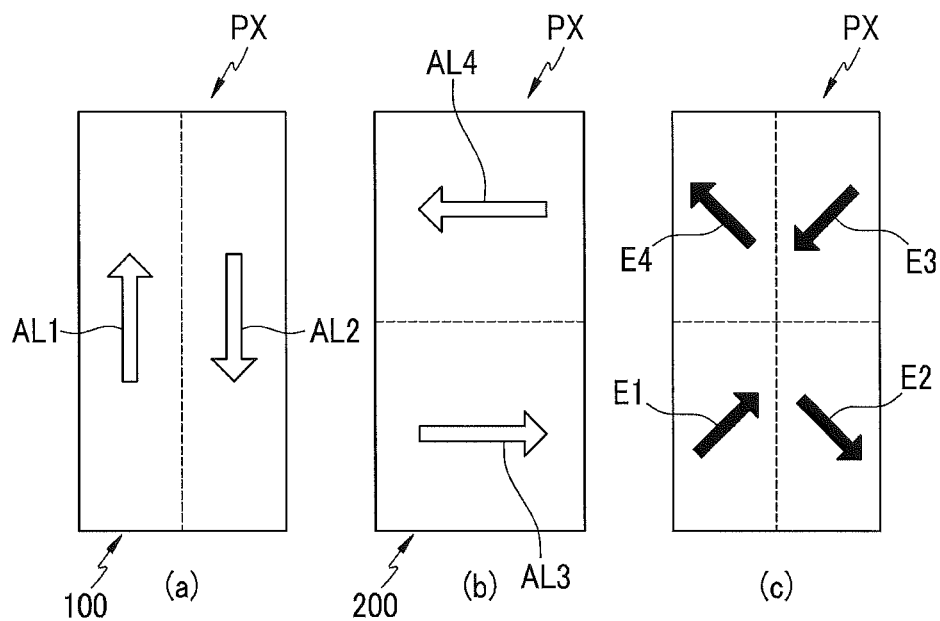

The exemplary embodiment of the photoalignment method illustrated in FIG. 4C is substantially the same as the exemplary embodiment illustrated in FIG. 4A, but an irradiation direction of light to the upper panel 200 may be different from the irradiation direction of the exemplary embodiment illustrated in FIG. 4A. Referring to FIG. 4C(a), the pretilt direction of the liquid crystal molecule 31 in the unit pixel PX of the lower panel 100 of the liquid crystal display in FIG. 4C is substantially the same as in the unit pixel PX of the lower panel 100 in FIG. 4A(a). Referring to FIG. 4C(b), by irradiating light to the upper panel 200 of the liquid crystal display as shown in FIG. 4C(a), the pretilt direction of the liquid crystal molecule 31 that is substantially close to the surface of the upper panel 200 becomes the fourth alignment direction AL4 at an upper part of the unit pixel PX, and the pretilt direction of the liquid crystal molecule 31 that is substantially close to the surface of the upper panel 200 becomes the third alignment direction AL3 at a lower part of the unit pixel PX. When the liquid crystal display panel is completed by connecting the lower and upper panels 100 and 200, the liquid crystal molecules 31 may be aligned as illustrated in FIG. 4C(c) at an intermediate part of the liquid crystal layer 3. In such an embodiment, the liquid crystal molecule 31 at a right upper part of the unit pixel PX may be pretilted in the left lower alignment direction E3, the liquid crystal molecule 31 at a right lower part of the unit pixel PX may be pretilted in the right lower alignment direction E2, the liquid crystal molecule 31 at a left lower part of the unit pixel PX may be pretilted in the right upper alignment direction E1, and the liquid crystal molecule 31 at a left upper part of the unit pixel PX may be pretilted in the left upper alignment direction E4.

Figure 4D:
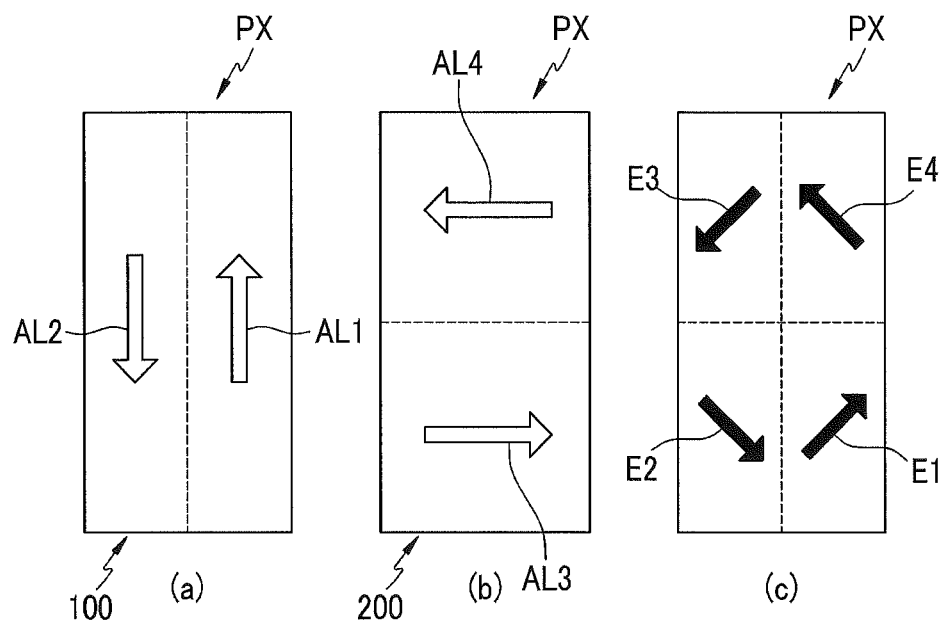

The exemplary embodiment of the photoalignment method illustrated in FIG. 4D is substantially the same as the exemplary embodiment illustrated in FIG. 4A, but an irradiation direction of light to the lower and upper panels 100 and 200 may be different from the irradiation direction of light to the lower and upper panels 100 and 200 of the exemplary embodiment illustrated in FIG. 4A. In one exemplary embodiment, for example, referring to FIG. 4D(a), the pretilt direction of the liquid crystal molecule 31 that is substantially close to the surface of the lower panel 100 is opposite to the direction illustrated in FIG. 4A(A) at the left and right parts of the unit pixel PX of the lower panel 100, and the pretilt direction of the liquid crystal molecule 31 that is substantially close to the surface of the upper panel 200 is opposite to the direction illustrated in FIG. 4A(a) at the upper and lower parts of the unit pixel PX of the upper panel 200. Therefore, when the liquid crystal panel is completed by connecting the lower and upper display panels 100 and 200, the liquid crystal molecule 31 at the intermediate part of the liquid crystal layer 3 is aligned as illustrated in FIG. 4D(c). In such an embodiment, the liquid crystal molecule 31 at the right upper part of the unit pixel PX may be pretilted in the left upper alignment direction E4, the liquid crystal molecule 31 at the right lower part of the unit pixel PX may be pretilted in the right upper alignment direction E1, the liquid crystal molecule 31 at the left lower part of the unit pixel PX may be pretilted in the right lower alignment direction E2, and the liquid crystal molecule 31 at the left upper part of the unit pixel PX may be pretilted in the left lower alignment direction E3.

Hereinafter, an exemplary embodiment of the photomask included in the exposure apparatus used in the photoalignment process will be described in detail with reference to FIGS. 5 and 6.

Figure 5:
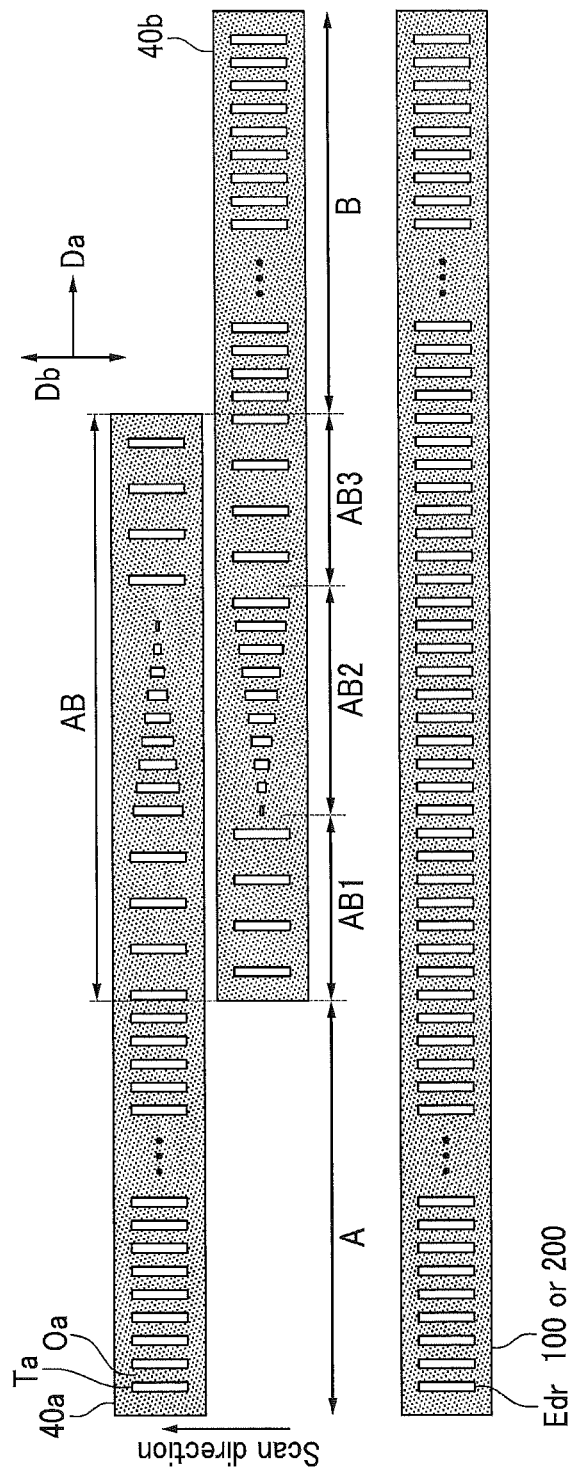
FIG. 5 is a plan view of an exemplary embodiment of a photomask used in a photoalignment process according to the invention.
Figure 6:
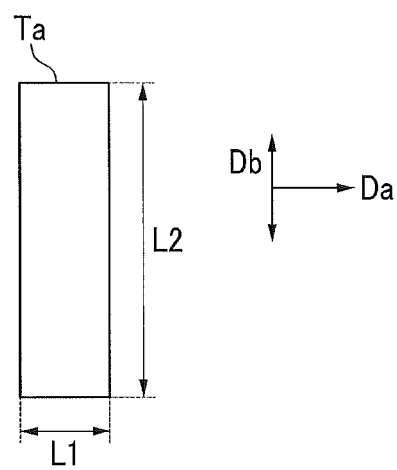
FIG. 6 is a plan view of an exemplary embodiment of a transmission part of a photomask used in a photoalignment process according to the invention.

FIG. 5 is a plan view of an exemplary embodiment of a photomask used in a photoalignment process according the invention, and FIG. 6 is a plan view of an exemplary embodiment of a transmission part of a photomask used in a photoalignment process according to the invention.

Referring to FIG. 5, an exemplary embodiment of the exposure apparatus according to the invention includes at least two photomask rows. Each of the at least two photomask rows includes at least two photomasks, and two photomasks included in the photomask rows that are substantially close to each other partially overlap each other. Hereinafter, the least two photomasks that partially overlap each other may include a first photomask 40a and a second photomask 40b.

In an exemplary embodiment, the first and the second photomasks 40a and 40b include a plurality of transmission parts Ta and light blocking parts Oa. The transmission part Ta and the light blocking part Oa may be alternately arranged, and an arrangement pattern thereof and the shape of the transmission part Ta may be various. Each of the first photomask 40a and the second photomask 40b includes a light source, as shown in FIG. 2.

The first and the second photomasks 40a and 40b scan the lower and upper panels 100 and 200 in the second direction Db and obliquely irradiate light, such as ultraviolet rays, to the surfaces of the lower and upper panels 100 and 200. In such an embodiment, portions of the first and the second photomasks 40a and 40b overlap each other, and the overlapping portions scan the same region on the lower and upper panels 100 and 200. A region in the first photomask 40a that does not overlap the second photomask 40b is a non-overlapping region of the first photomask 40a, e.g., a first region A, a region in the second photomask 40b that does not overlap the first photomask 40a is a non-overlapping region of the second photomask 40b, e.g., a second region B, and a region in which the first and the second photomasks 40a and 40b overlap each other is an overlapping region AB.

In the first, second and overlapping regions A, B and AB, the transmission parts Ta of the first and the second photomasks 40a and 40b are arranged at a constant interval in a first direction Da that is substantially perpendicular to the second direction Db, and a pitch of the arranged transmission parts Ta, that is, a distance between the same sides of the adjacent transmission parts Ta, may be substantially the same as a length in the first direction Da of a unit pixel PX.

The transmission parts Ta of the first region A and the second region B have substantially a rectangular shape, but the shape thereof is not limited thereto. The transmission part Ta illustrated in FIG. 6 includes a length side that is substantially parallel to the second direction Db and a width side that is substantially parallel to the first direction Da that is substantially perpendicular to the second direction Db. Hereinafter, a length direction may coincide with the second direction Db and a width direction may coincide with the first direction Da with respect to a transmission part Ta. A length L2 of the length side may be greater than a length L1 of the width side, and the length L1 of the width side may be a half pitch of a unit pixel PX, that is, about a half of the length in the first direction Da of the unit pixel PX.

The overlapping region AB includes at least two subregions in which shapes or arrangement forms of the transmission parts Ta included in at least one of the first photomask 40a and the second photomask 40b are different from each other.

In an exemplary embodiment, as shown in FIG. 5, the overlapping region AB of the first and the second photomasks 40a and 40b includes three subregions, e.g., a first subregion AB1, a second subregion AB2, and a third subregion AB3, sequentially arranged in the first direction Da. In an exemplary embodiment, an area of the transmission part Ta of the first, second and third subregions AB1, AB2 and AB3 of the overlapping region AB may be less than an area of the transmission part Ta of the first region A or the second region B. In an alternative exemplary embodiment, an interval of the transmission part Ta of the first, second and third subregions AB1, AB2 and AB3 of the overlapping region AB may greater than an interval of the transmission part Ta of the first region A or the second region B.

In an exemplary embodiment, referring to FIG. 5, the shape of each transmission part Ta in the first and third subregions AB1 and AB3 is substantially the same as the transmission part Ta illustrated in FIG. 6 or the transmission part Ta of the first region A and the second region B. In such an embodiment, the irradiation regions corresponding to the transmission parts Ta of the first photomask 40a and the second photomask 40b in the first and third subregions AB1 and AB3 do not overlap each other. The transmission part Ta of the first photomask 40a and the transmission part Ta of the second photomask 40b in the first and third subregions AB1 and AB3 are alternately arranged in the first direction Da, and the pitch of the transmission part Ta of each of the photomasks 40a and 40b in the first and third subregions AB1 and AB3 may be about twice the pitch of the transmission part Ta of the first region A or the second region B.

In an exemplary embodiment, the irradiation regions of the transmission parts Ta of the first photomask 40a and the second photomask 40b in the second subregion AB2 between the first and third subregions AB1 and AB3 overlap each other. In such an embodiment, the lengths of the length sides of the transmission parts Ta of the first photomask 40a and the second photomask 40b may vary along the first direction Da. In one exemplary embodiment, for example, the length of the length side in the second direction Db of the transmission part Ta in the second subregion AB2 of the first photomask 40a may be gradually decreased from left to right in the first direction Da, and the length of the length side in the second direction Db of the transmission part Ta in the second subregion AB2 of the second photomask 40b may be gradually increased from left to right in first direction Da. Accordingly, an irradiation amount of light through the transmission part Ta of the first photomask 40a or the second photomask 40b is gradually decreased or increased from left to right in the first direction Da.

In an exemplary embodiment, a sum total of the area of the transmission part Ta of the first photomask 40a and the second photomask 40b corresponding to each other in the second subregion AB2 may be about 80% to about 150% of the area of one transmission part Ta of the first region A or the second region B. Therefore, the irradiation amount of light of a portion exposed by the first and the second photomasks 40a and 40b in the second subregion AB2 may be about 80% to about 150% of the irradiation amount of light of the irradiation region corresponding to the one transmission part Ta of the first and the second regions A and B. In such an embodiment, even when the irradiation amount of light of a portion exposed by the first and the second photomasks 40a and 40b in the second subregion AB2 is greater than 100% of the irradiation amount of light of the irradiation region corresponding to one transmission part Ta of the first and the second regions A and B, the pretilt angles of the liquid crystal molecules 31 by the alignment strength of the alignment layers 11 and 21 may be substantially the same as each other.

The irradiation amount of light with respect to the lower and upper panels 100 and 200 is illustrated in FIG. 5.

Referring to FIG. 5, the irradiation amount of light Edr of the lower and upper panels 100 and 200 in which light is irradiated through the first and the second photomasks 40a and 40b is represented by the area corresponding to the transmission part Ta. In such an embodiment, the irradiation amount of light Edr is generally uniformly distributed throughout the first, second and overlapping regions A, B, and AB of the first and the second photomasks 40a and 40b.

In an exemplary embodiment, a manufacturing cost of the mask is substantially deceased and manufacturing of large display panels is substantially improved by using two or more photomasks in the photo alignment process. In such an embodiment, where two or more photomasks are used, as shown in FIG. 5, the occurrence of a boundary line between light irradiation regions and display defects by irradiating light by partially overlapping photomasks are substantially decreased.

In an exemplary embodiment, the shape and the disposal of the transmission part Ta in the overlapping region AB are effectively modified such that the sum total of the irradiation amount of light through the transmission part Ta of the overlapping region AB of the first and the second photomasks 40a and 40b is substantially uniform and substantially the same as the irradiation amount of light through the transmission part Ta of the first region A or the second region B. Various alternative exemplary embodiments will be described with reference to FIGS. 7 to 15.

Figure 7:
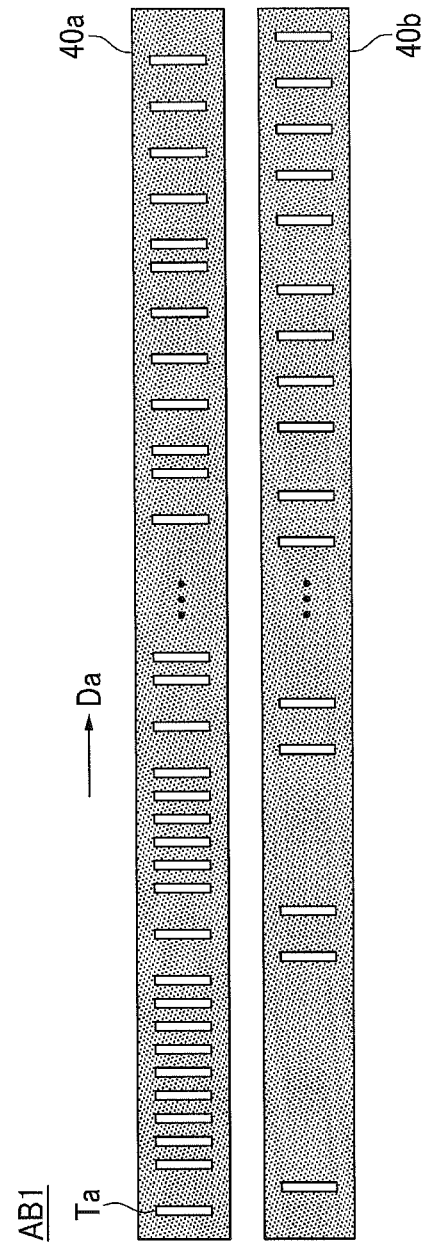
FIGS. 7 to 9 are top plan views of an alternative exemplary embodiment of photomask illustrating various disposals and shapes of the transmission part in the overlapping region thereof according to the invention.
Figure 8:
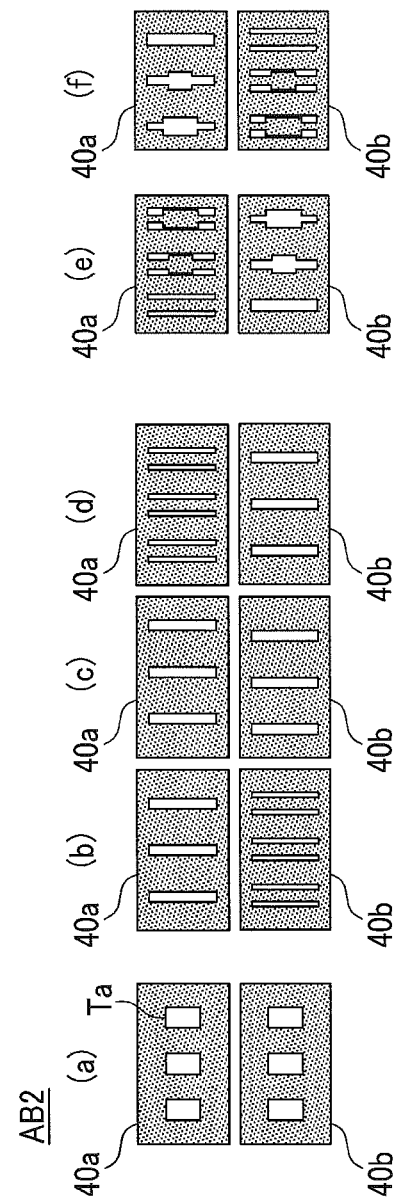
Figure 9:
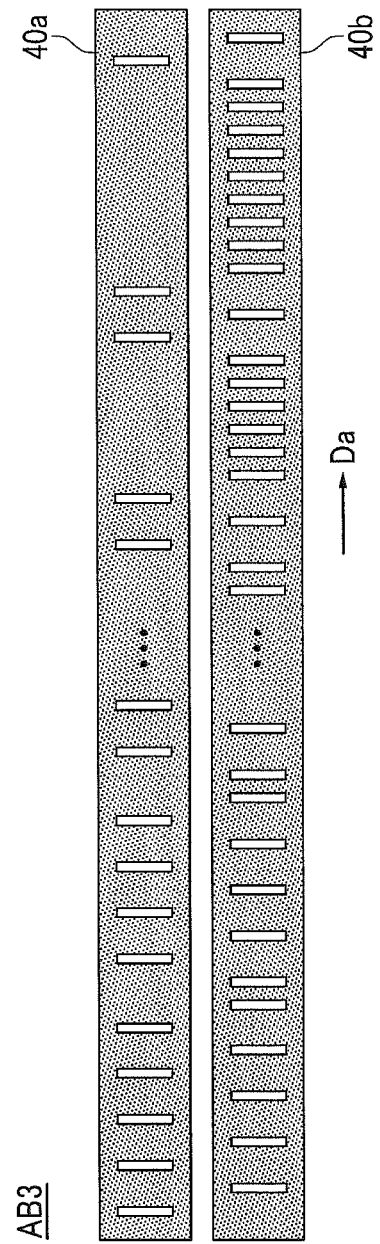
Figure 10:
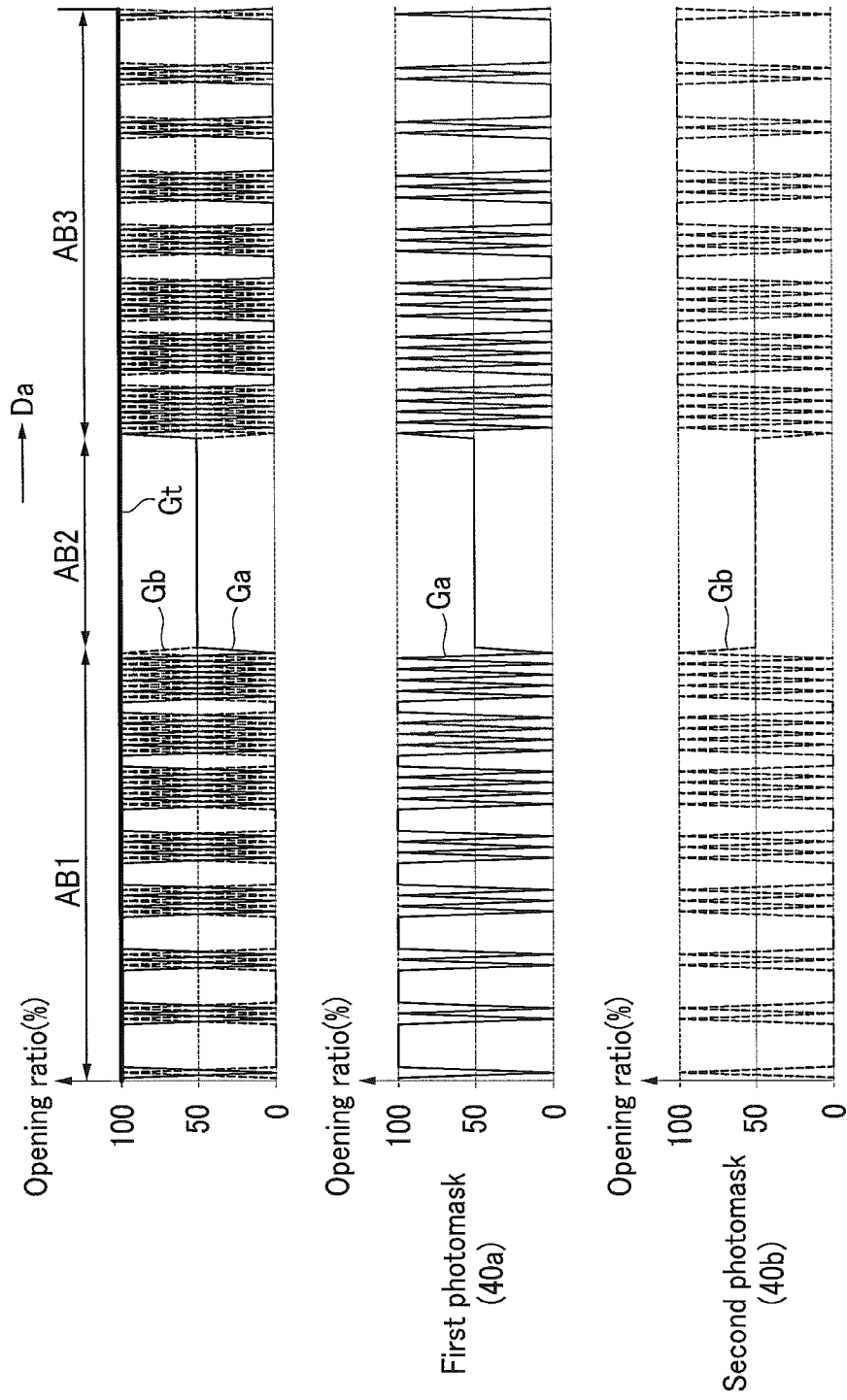
FIG. 10 is a graph illustrating aperture ratio versus position of the photomasks illustrated in FIGS. 7, 8 and 9.
Figure 11:
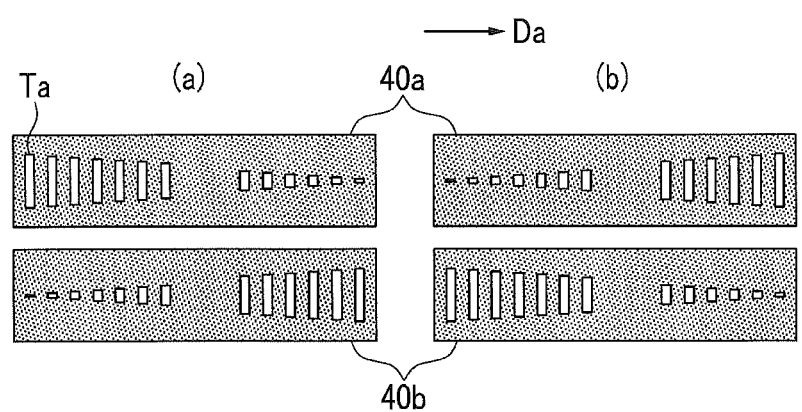
FIG. 11 is a top plan view of another alternative exemplary embodiment of the photomask illustrating disposals and shapes of the transmission part in the overlapping region thereof according to the invention.
Figure 12:
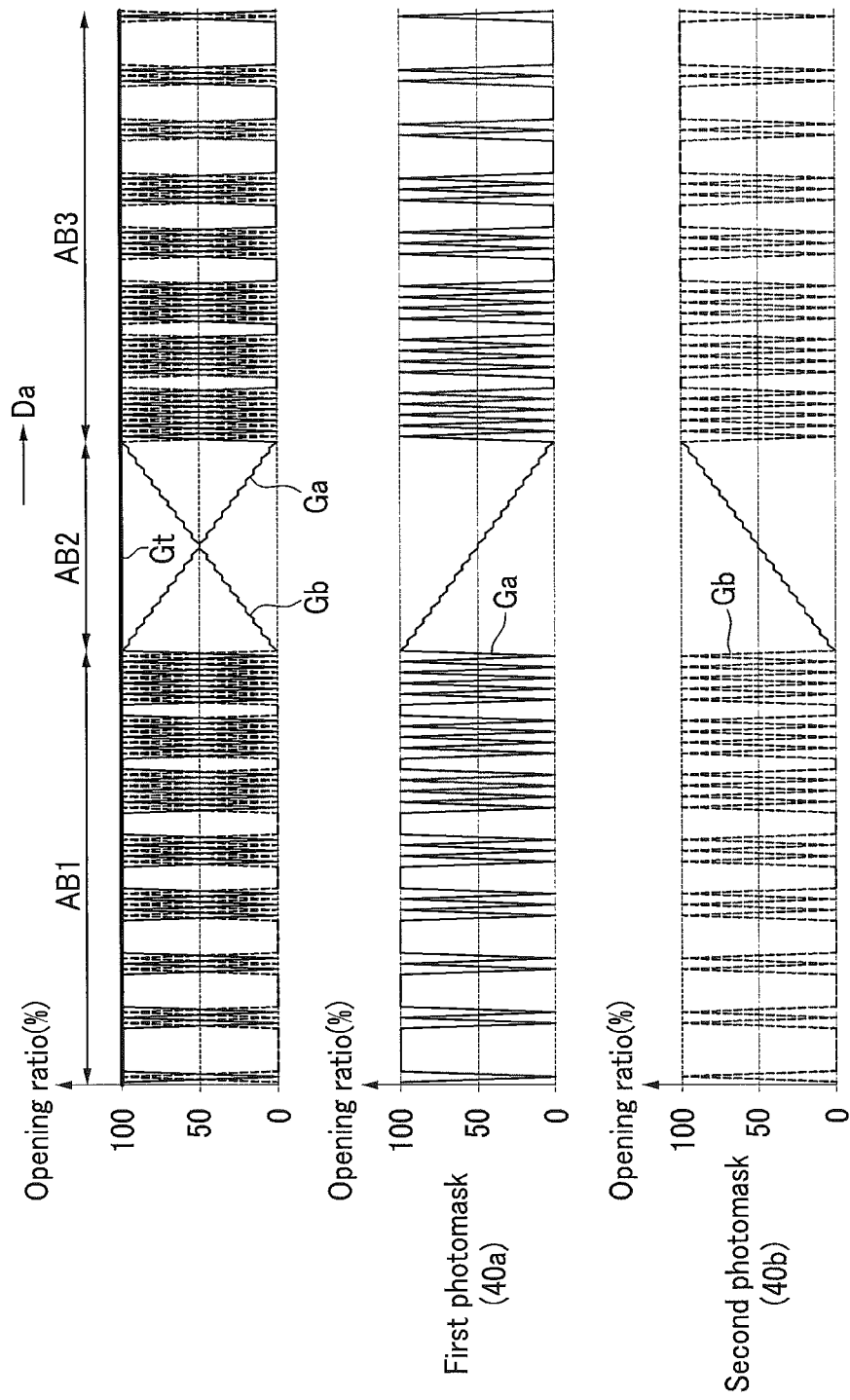
FIG. 12 is a graph illustrating aperture ratio versus position of the photomasks illustrated in FIGS. 7, 9 and 11.
Figure 13:
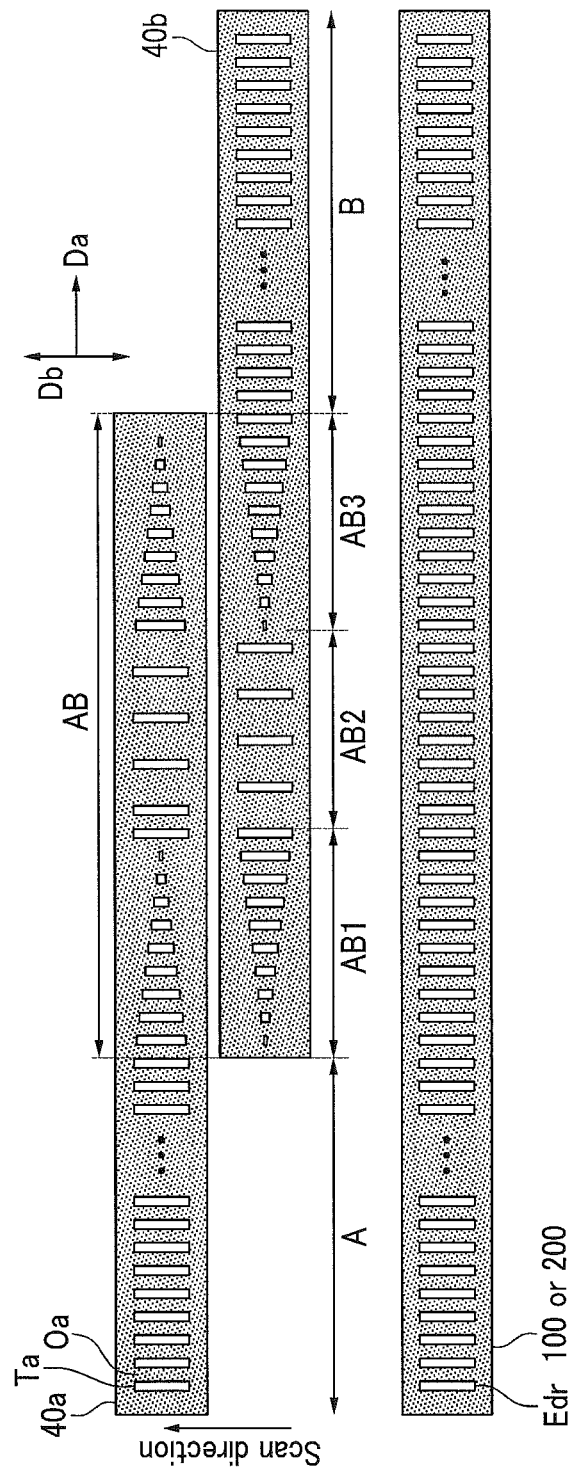
FIG. 13 is a top plan view of still another alternative exemplary embodiment of the photomask illustrating disposals and shapes of the transmission part in the overlapping region thereof according to the invention.
Figure 14:
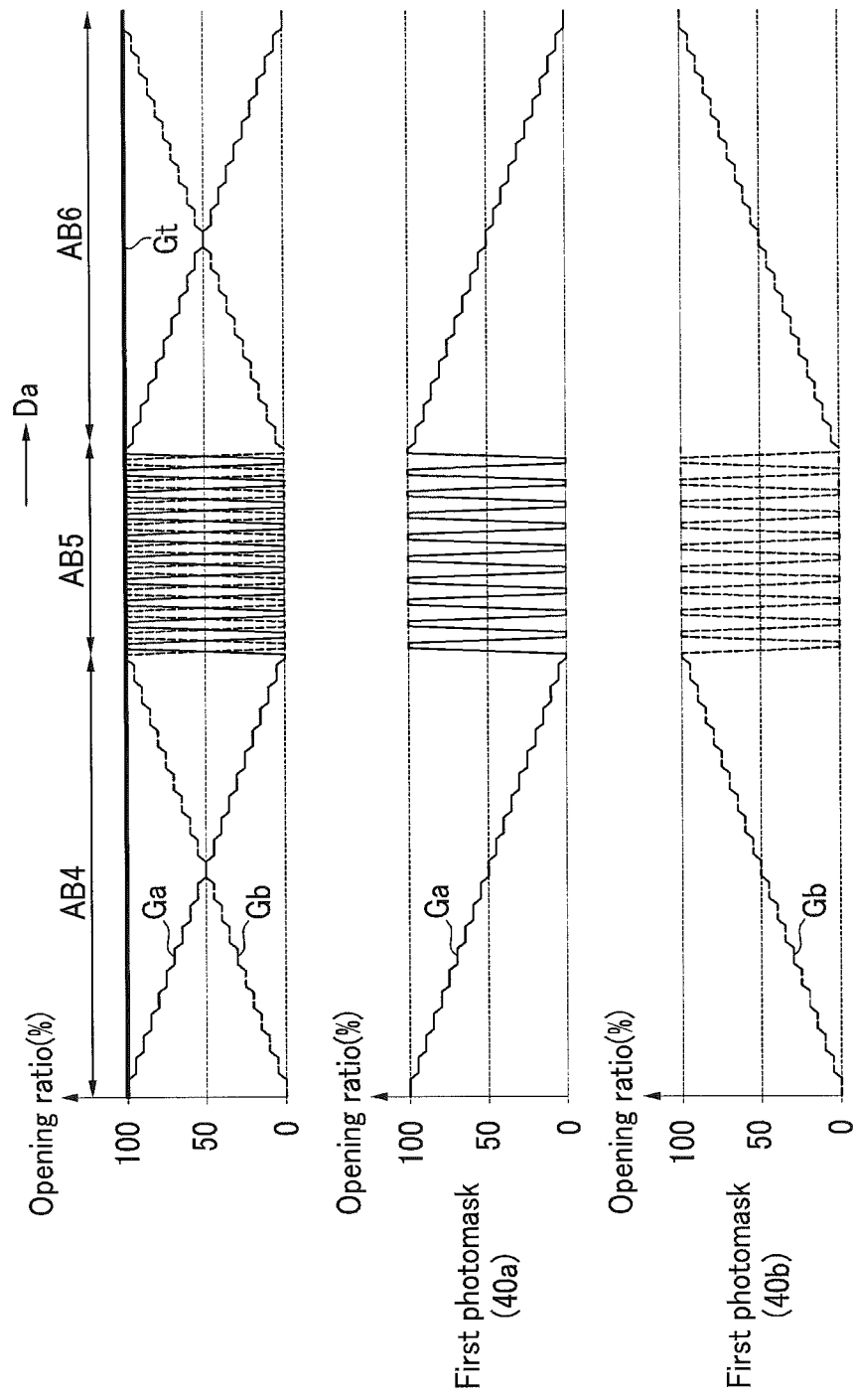
FIG. 14 is a graph illustrating aperture ratio versus position of the photomask illustrated in FIG. 13.
Figure 15:
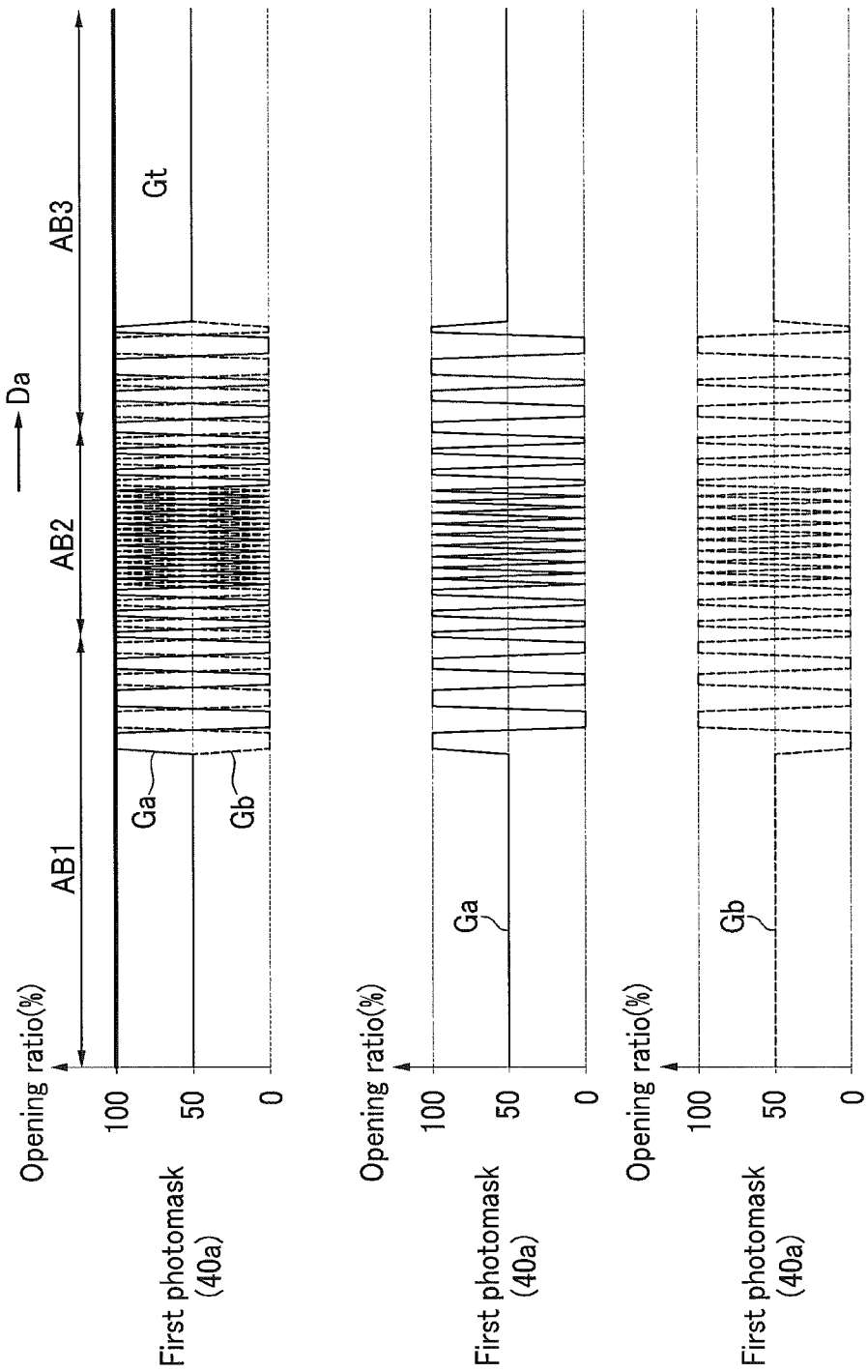
FIG. 15 is a graph illustrating aperture ratio versus position of an alternative exemplary embodiment of the photomask according to the invention.

FIGS. 7, 8 and 9 are top plan views of an alternative exemplary embodiment of a photomask illustrating various disposals and shapes of the transmission part in the overlapping region thereof according to the invention, FIG. 10 is a graph illustrating aperture ratio (%) versus position of the photomasks illustrated in FIGS. 7, 8 and 9, FIG. 11 is a top plan view of another alternative exemplary embodiment of the photo mask illustrating disposals and shapes of the transmission part in the overlapping region thereof according to the invention, FIG. 12 is a graph illustrating aperture ratio versus position of the photomask illustrated in FIGS. 7, 9 and 11, FIG. 13 is a top plan view of still another alternative exemplary embodiment of the photomask illustrating disposals and shapes of the transmission part in the overlapping region thereof according to of the invention, FIG. 14 is a graph illustrating aperture ratio versus position of the photomask illustrated in FIG. 13, and FIG. 15 is a graph illustrating aperture ratio versus position of an alternative exemplary embodiment of the photomask according to the invention.

Referring to FIGS. 7 to 10, the structure of the overlapping region AB of the first and the second photomasks 40a and 40b of the illustrated exemplary embodiment is different from that of the exemplary embodiment illustrated in FIG. 5.

Referring to FIG. 7, the first subregion AB1 of the overlapping region AB of the illustrated exemplary embodiment of the photomask is substantially the same as the exemplary embodiment illustrated in FIG. 5 except the transmission part Ta of the first and second photomasks 40a and 40b arranged along the first direction Da, in which the arrangement interval of the transmission part Ta on the first photomask 40a increases toward the first direction Da, and the arrangement interval of the transmission part Ta on the second photomask 40b decreased toward the first direction Da. In an exemplary embodiment, the invention is not limited to the illustrated exemplary embodiments, and the arrangement interval may be controlled in a various way.

Referring to FIG. 9, the third subregion AB3 of the overlapping region AB of the illustrated exemplary embodiment is substantially the same as the first subregion AB1 illustrated in FIG. 7 except a change in the arrangement interval, which is opposite to a change in the arrangement interval of the transmission part Ta in FIG. 7.

In the second subregion AB2 illustrated in FIG. 8, an area of any one of the transmission parts Ta included in the first photomask 40a and the second photomask 40b is about a half of the area of the transmission part Ta illustrated in FIG. 5.

In the second subregion AB2 illustrated in FIG. 8(a), the transmission parts Ta of the first and the second photomasks 40a and 40b may irradiate light to the same irradiation region as in FIG. 5. In the second subregion AB2, the length of the length side of the transmission part Ta may be about a half of the length L2 of the length side of the transmission part Ta illustrated in FIG. 5.

In the second subregion AB2 illustrated in FIGS. 8(b) to 8(f), the irradiation regions corresponding to the transmission parts Ta of the first and the second photomasks 40a and 40b do not overlap each other. However, when the corresponding transmission parts Ta of the first and the second photomasks 40a and 40b are combined to form a combined shape, the combined shape is approximately the same as a transmission part Ta illustrated in FIG. 5. Accordingly, the irradiation amount of light of the irradiation region corresponding to the second subregion AB2 is substantially the same as the irradiation amount of light of the first region A or the second region B. In such an embodiment, the shape of the transmission part Ta may be variously changed as illustrated in FIGS. 8(b) to 8(f), but the invention is not limited thereto.

Referring to FIG. 10, an aperture ratio graph Ga along the first direction Da of the transmission part Ta of the first photomask 40a and an aperture ratio graph Gb along the first direction Da of the transmission part Ta of the second photomask 40b illustrated in FIGS. 7, 8 and 9 are illustrated. The aperture ratio is expressed in a percent of the area of the transmission part Ta of the first region A or the second region B, and the irradiation amount of light through the transmission part Ta is expressed in a percent f the irradiation amount of light through the transmission part Ta of the first region A or the second region B. In an exemplary embodiment, the sum total Gt of the irradiation amounts of light through the transmission part Ta is substantially constant over the entire overlapping region, e.g., the first, second and third subregions AB1, AB2 and AB3, of the first and the second photomasks 40a and 40b, and may be substantially the same as the irradiation amount of light through one transmission part Ta in the first region A and the second region B.

The exemplary embodiment illustrated in FIGS. 11 and 12 is substantially the same as the exemplary embodiment illustrated in FIGS. 7 to 9 described above, except the shape of the transmission part Ta in the second subregion AB2. The exemplary embodiment illustrated in FIG. 11(a) is substantially the same as the second subregion AB2 of the overlapping region AB of the first and the second photomasks 40a and 40b illustrated in FIG. 5 described above. However, in the exemplary embodiment illustrated in FIG. 11(b), the length of the length side of the transmission part Ta of the first photomask 40a increases left to right in the first direction Da, and the length of the length side of the transmission part Ta of the second photomask 40b decreases left to right in the first direction Da. However, the sum total of the areas of the transmission part Ta of the first photomask 40a and the second photomask 40b that correspond to each other in the second subregion AB2 may be substantially the same as the area of the transmission part Ta illustrated in FIG. 6.

Referring to FIG. 12, an aperture ratio graph Ga along the first direction Da of the transmission part Ta of the first photomask 40a and an aperture ratio graph Gb along the first direction Da of the transmission part Ta of the second photomask 40b illustrated in FIG. 11 are illustrated. The aperture ratio graphs Ga and Gb in the first and third subregions AB1 and AB3 are substantially the same as the aperture ratios in the first and third subregions AB1 and AB3 in FIG. 10, but the aperture ratio graphs Ga and Gb in the second subregion AB2 are increased or decreased based on a change in the length of the length direction or the area of the transmission part Ta. Similarly to FIG. 10, the sum total Gt of the irradiation amounts of light through the transmission part Ta in the overlapping region AB of the first and the second photomasks 40a and 40b is substantially constant over the entire overlapping region, e.g., the first, second and third subregions AB1, AB2 and AB3, and may be substantially the same as the irradiation amount of light through one transmission part Ta in the first region A and the second region B.

The exemplary embodiment illustrated in FIGS. 13 and 14 is substantially the same as the exemplary embodiment shown in FIG. 5 except the arrangement structures of the transmission parts Ta of the second subregion AB2 and the first and third subregions AB1 and AB3 of the overlapping region AB. In such an embodiment, the shape of the transmission part Ta in the second subregion AB2 is substantially the same as the shape of the transmission part Ta in the second subregion AB2 illustrated in FIG. 6, and the transmission parts Ta of the first and the second photomasks 40a and 40b do not overlap each other or are not aligned and are alternately arranged. In the first and third subregions AB1 and AB3, length of the transmission part Ta in the length direction, that is in the second direction Db, is gradually increased or decreased. Accordingly, as shown in FIG. 14, the aperture ratio Ga of the transmission part Ta of the first photomask 40a in the first and third subregions AB1 and AB3 and the aperture ratio Gb of the transmission part Ta of the second photomask 40b in the first and third subregions AB1 and AB3 are gradually decreased or increased according to the first direction Da, and the aperture ratios Ga and Gb show 100% at a constant interval in the second subregion AB2. In such an embodiment, the sum total Gt of the irradiation amounts of light through the transmission part Ta is constant over the entire overlapping region, e.g., the first, second and third subregions AB1, AB2 and AB3, of the first and the second photomasks 40a and 40b, and may be substantially the same as the irradiation amount of light through one transmission part Ta in the first region A and the second region B.

Referring to FIG. 15, the transmission part Ta in the first and third subregions AB1 and AB3 of the overlapping region AB of the first and the second photomasks 40a and 40b has a size that is about a half of the transmission part Ta illustrated in FIG. 6, and thus, the aperture ratio thereof may be about 50%. In the second subregion AB2, the transmission parts Ta of the first and the second photomasks 40a and 40b do not overlap each other, that is they are not aligned, and a plurality of transmission parts Ta form a plurality of groups, the number of transmission part Ta included in one group and the interval between the adjacent groups are gradually decreased from the left toward the center of the second subregion AB2. This characteristic is illustrated in the graphs Ga and Gb of FIG. 15. In the illustrated exemplary embodiment, the sum total Gt of the irradiation amounts of light through the transmission part Ta is constant over the entire overlapping region AB, e.g., the first, second and third subregions AB1, AB2 and AB3, of the first and the second photomasks 40a and 40b.

In an exemplary embodiment, the number of transmission parts Ta of the overlapping region AB may be in a range of 10 to 30, but the invention is not limited thereto. In an exemplary embodiment, the length in the first direction Da of the overlapping region AB may be in a range of about 10 millimeters (mm) to about 100 mm, but the invention is not limited thereto.

Next, exemplary embodiments of a photoalignment method and a photomask according to the invention will be described with reference to FIGS. 16 and 17.

Figure 16:
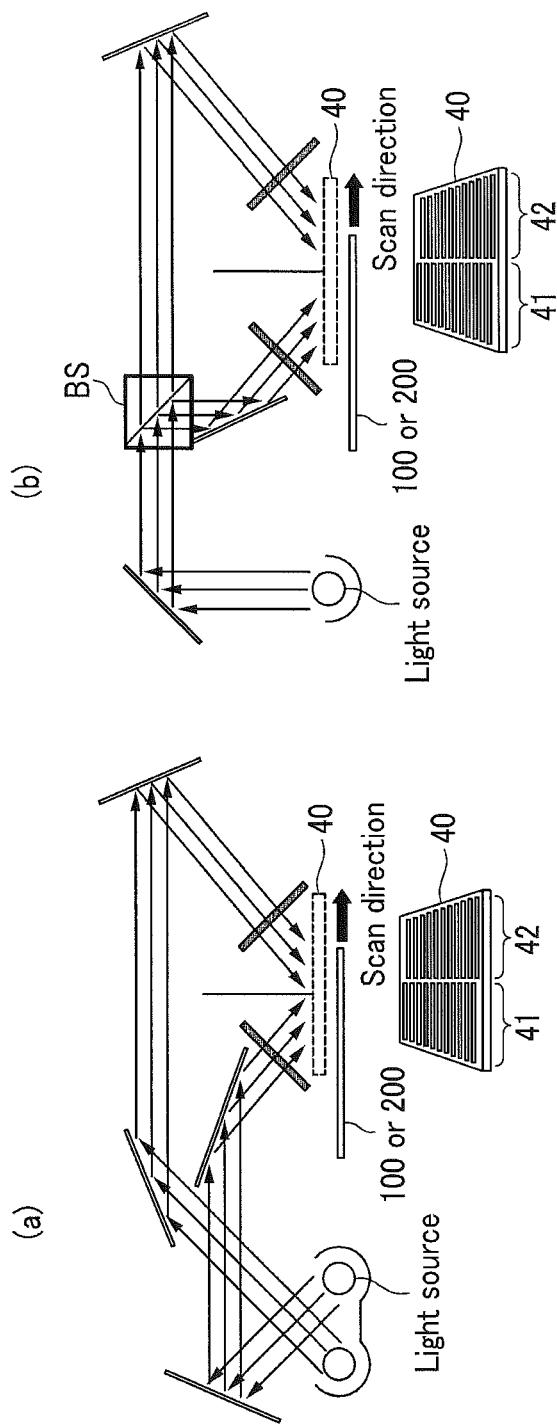
FIG. 16 is a plan view illustrating an exemplary embodiment of a photoalignment process according to the invention.
Figure 17:
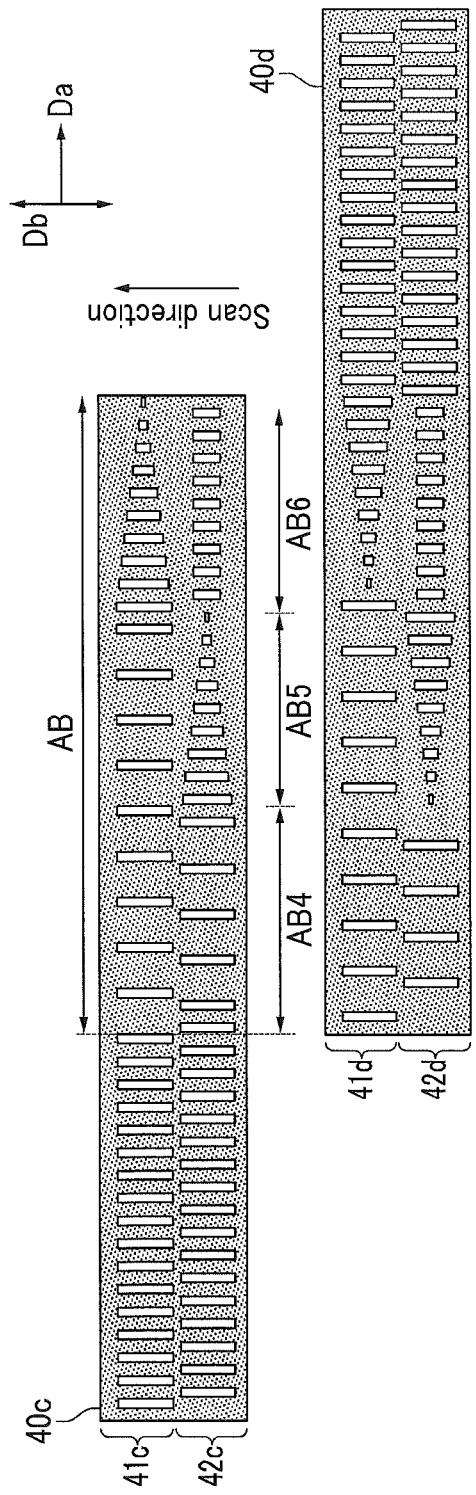
FIG. 17 is a top plan view of an exemplary embodiment of the photomask used in the photoalignment process illustrated in FIG. 16.

FIG. 16 is a plan view of an exemplary embodiment of a photoalignment process according to the invention, and FIG. 17 is a top plan view of an exemplary embodiment of the photomask used in the photoalignment process illustrated in FIG. 16.

Referring to FIG. 16, a plurality of domains, in which the alignment directions are different from each other, may be formed in a unit pixel PX by a single exposure process. This process is called a dual exposure process. In an exemplary embodiment of a dual exposure apparatus illustrated in FIG. 16(a), exposures, in which irradiation directions are different from each other, may be performed at a time to the lower and upper panels 100 and 200 using two light sources and a plurality of mirrors and polarizers. In an exemplary embodiment of the dual exposure apparatus illustrated in FIG. 16(b), exposures, in which irradiation directions are different from each other, may be performed at a time using one light source and a plurality of mirrors and beam splitters BS. In such an embodiment, the photomask 40 includes two parts 41 and 42 corresponding to different irradiation regions, and lights, of which irradiation directions are different from each other, pass through the transmission parts of the two parts 41 and 42 and are irradiated thereto.

Referring to FIG. 17, in an exemplary embodiment of a dual exposure process, a first photomask 40c includes a first row 41c and a second row 42c that are substantially close to each other in the second direction Db, and a second photomask 40d includes a first row 41d and a second row 42d that are substantially close to each other in the second direction Db.

In the first region A and the second region B, in which the first and the second photomasks 40c and 40d do not overlap each other, the transmission part Ta of the first row 41c and the transmission part Ta of the second row 42c of the first photomask 40c are alternately disposed, and the transmission part Ta of the second row 42c is disposed between the adjacent transmission parts Ta of the first row 41c. The first direction Da length of the transmission part Ta of the first row 41c or the second row 42c is substantially the same as a half of the first direction Da length of the unit pixel PX.

In an exemplary embodiment, as shown in FIG. 17, the overlapping region AB of the first and the second photomasks 40c and 40d includes a plurality of subregions, e.g., a fourth subregion AB4, a fifth subregion AB5 and a sixth subregion AB6, in which shapes or arrangements of the transmission part Ta are different from each other. In an alternative exemplary embodiment, the overlapping region AB may include only one of the fourth, fifth and sixth subregions AB4, AB5 and AB6.

In the fourth and fifth subregions AB4 and AB5, the irradiation regions of the transmission parts Ta of the first row 41c of the first photomask 40c and the first row 41d of the second photomask 40d do not overlap each other, and the transmission parts Ta are alternately disposed at a constant interval in the first direction Da. Accordingly, the irradiation amount of light of the transmission part Ta in the first rows 41c and 41d of the first and the second photomasks 40c and 40d in the fourth and fifth subregions AB4 and AB5 is substantially the same as the irradiation amount of light through one transmission part Ta in the first rows 41c and 41d of the first region A and the second region B. Similarly, the irradiation amount of light of the transmission part Ta of the first and the second photomasks 40c and 40d in the second rows 42c and 42d of the fourth subregion AB4 is substantially the same as the irradiation amount of light through one transmission part Ta in the second rows 42c and 42d of the first region A or the second region B.

In the sixth subregion AB6, the irradiation regions of the transmission parts Ta of the first row 41c of the first photomask 40c and the first row 41d of the second photomask 40d overlap each other. In such an embodiment, the length of the length side of the transmission part Ta of the first photomask 40c is gradually decreased from left to right in the first direction Da, and the length of the length side of the transmission part Ta of the second photomask 40d is gradually increased from left to right in the first direction Da. Accordingly, the total irradiation amount of light through the transmission part Ta in the first rows 41c and 41d of the sixth subregion AB6 may be substantially the same as, or greater than, the irradiation amount of light through one transmission part Ta of the first region A or the second region B.

In the sixth subregion AB6, the irradiation region corresponding to the transmission part Ta of the second row 42c of the first photomask 40c and the irradiation region corresponding to the transmission part Ta of the second row 42d of the second photomask 40d overlap each other, but the length in the length side direction or the area of each transmission part Ta is substantially a half of the area of the transmission part Ta illustrated in FIG. 6. Accordingly, the total irradiation amount of light of the irradiation regions through the transmission part Ta in the sixth subregion AB6 may be substantially the same as or greater than the irradiation amount of light through one transmission part Ta in the first region A or the second region B.

In an alternative exemplary embodiment, the overlapping regions AB of the photomasks 40c and 40d of the dual exposure apparatus may include only one subregion. In such an embodiment, the transmission parts Ta of the first and the second photomasks 40c and 40d do not overlap each other, that is, the transmission parts Ta of the first and the second photomasks 40c and 40d are not aligned along a same line and are alternately arranged, or the irradiation regions aligned overlapping each other such that the areas of the overlapping (aligned) transmission parts Ta are combined, the total area of the combined transmission parts Ta may be substantially the same as the area of the transmission part Ta of the first and the second regions A and B.

Next, an alternative exemplary embodiment of a photomask of an exposure apparatus according to the invention will be described with reference to FIGS. 18 to 24. The same reference numerals designate the same elements throughout the exemplary embodiments, and any repetitive detailed description thereof will hereinafter be omitted.

Figure 18:
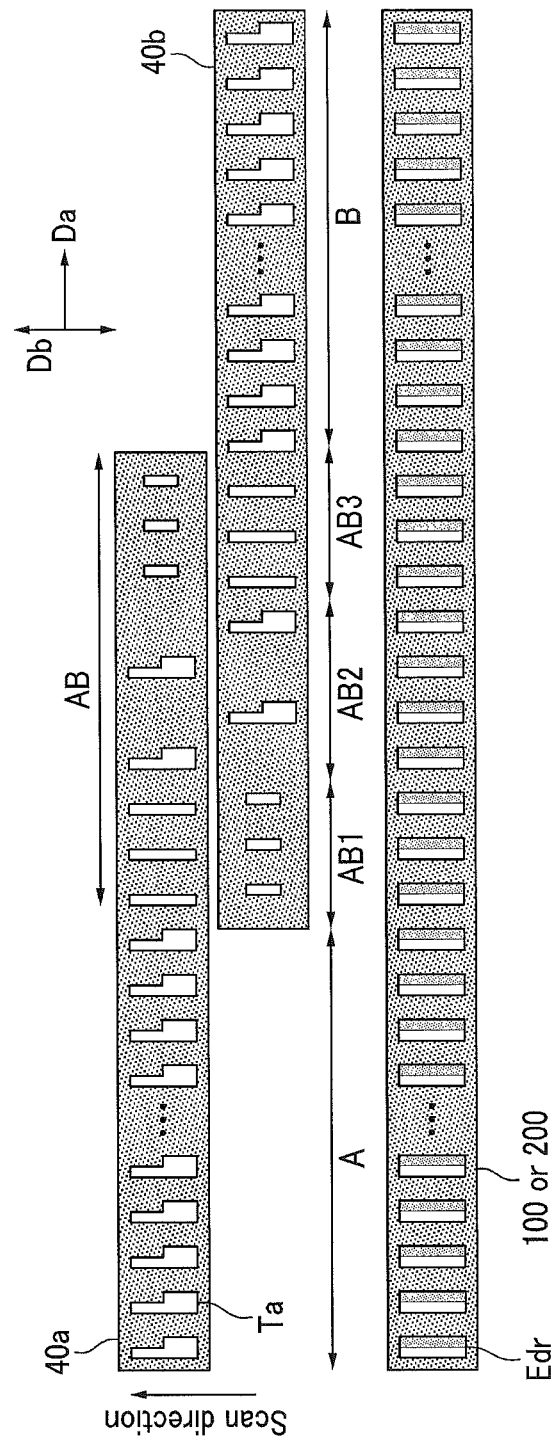
FIGS. 18, 20 and 22 are top plan views of alternative exemplary embodiments of a photomask used in a photoalignment process according to the invention.
Figure 19:
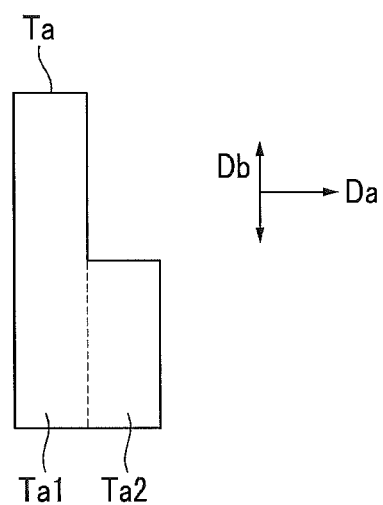
FIGS. 19 and 21 h are plan views illustrating transmission parts of the photomasks illustrated in FIGS. 18 and 19.
Figure 20:
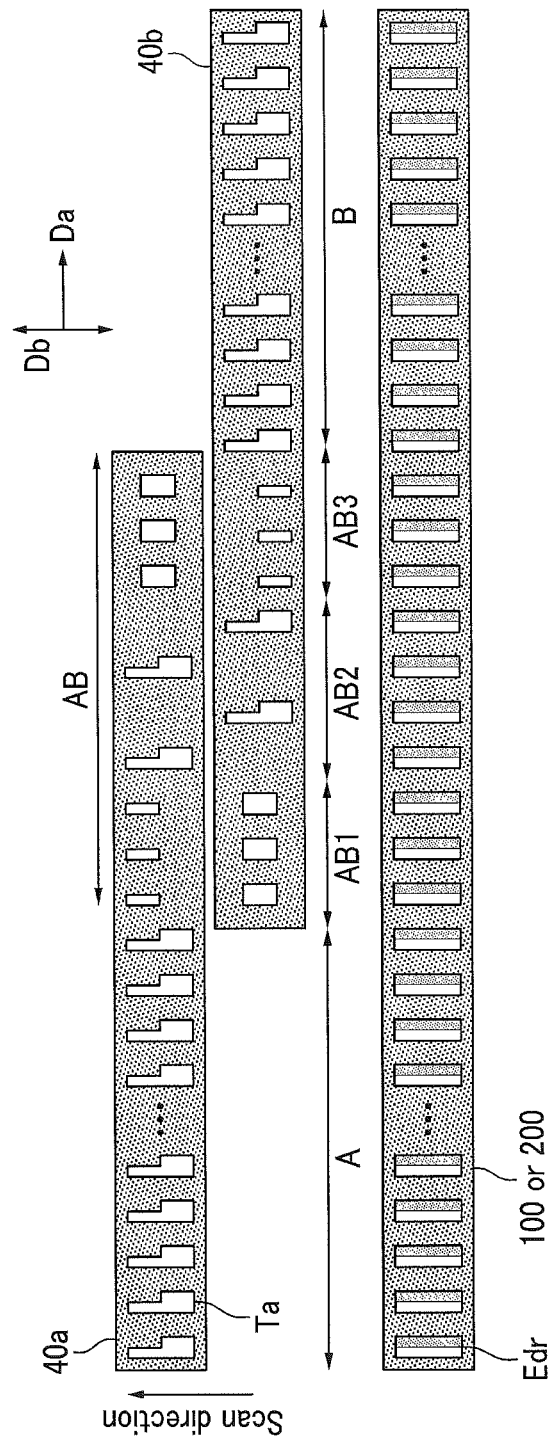
Figure 21:
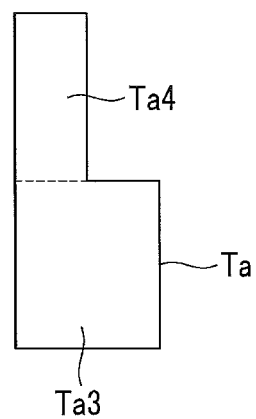
Figure 22:
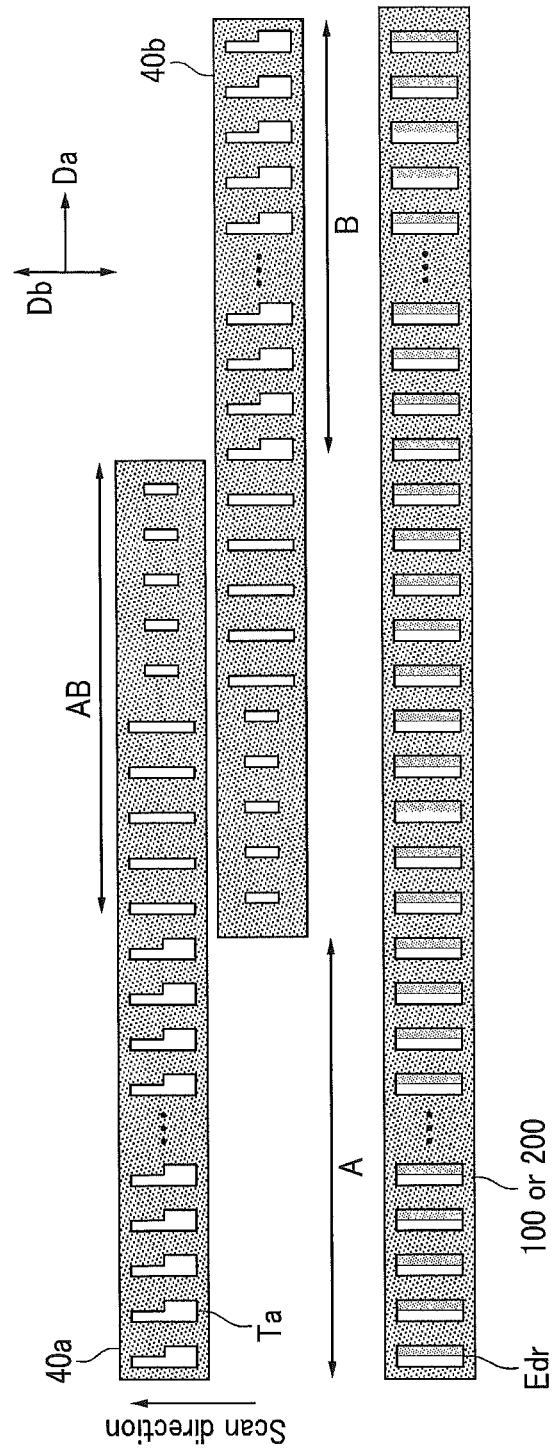
Figure 23:
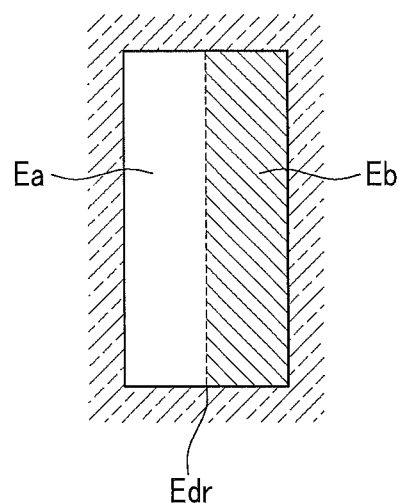
FIG. 23 is a plan view that illustrates an irradiation amount of light when an exposure is performed using the photomask illustrated in FIGS. 18, 20 and 22.

FIGS. 18, 20 and 22 are top plan views of an exemplary embodiment of a photomask used in a photoalignment process according to the invention, FIGS. 19 and 21 are plan views of a transmission part of the photomask illustrated in FIGS. 18 and 19, FIG. 23 is a block diagram illustrating an irradiation amount of light when exposure is performed using the photomask illustrated in FIGS. 18, 20 and 22, and FIG. 24 is a block diagram illustrating an irradiation amount of light to a unit pixel of the liquid crystal display when exposure is performed using the photomask illustrated in FIGS. 18, 20 and 22.

First, referring to FIGS. 18 and 19, an exemplary embodiment of the first and the second photomasks 40a and 40b are substantially the same as the photomasks of the exemplary embodiments described above except the shapes of the transmission part Ta. Referring to FIG. 19, an exemplary embodiment of the transmission part Ta included in at least one of the first and the second photomasks 40a and 40b may not be symmetric with respect to the first direction Da. In one exemplary embodiment, for example, the transmission parts Ta of the first and the second photomasks 40a and 40b may have a shape, a corner of which is cut away, corresponding to about ¼ of a rectangle, but the shape is not limited thereto. The transmission part Ta may have a shape, in which about ¼ of a polygon or an oval, or a left side or a right side of a circle is cut away.

Referring to FIG. 18, the transmission parts Ta in the first region A and the second region B are arranged at a constant interval, and the arranged pitch may be the same as the first direction Da length of the unit pixel PX. In an exemplary embodiment, at least one of the shape and arrangement form of the transmission parts Ta in the overlapping region AB of the first and the second photomasks 40a and 40b is different from at least one of those of the transmission parts Ta in the first region A and the second region B. In such an embodiment, the irradiation regions of the transmission parts Ta in the overlapping region AB of the first and the second photomasks 40a and 40b may not overlap each other.

The overlapping regions AB of the first and the second photomasks 40a and 40b may include two or more different subregions, in which the arrangement of the transmission part Ta are different from each other.

In the first subregion AB1, the transmission part Ta of the first photomask 40a corresponds to a left part Ta1 of the transmission part Ta illustrated in FIG. 19, and the transmission part Ta of the second photomask 40b corresponds to a right part Ta2 of the transmission part Ta illustrated in FIG. 19. In an alternative exemplary embodiment, the transmission part may be divided and allocated in a way, different from the transmission part shown in FIG. 19, to the first photomask 40a and the second photomask 40b, respectively.

The allocated shapes of the transmission parts Ta of the first and the second photomasks 40a and 40b in the third subregion AB3 are opposite to the allocated shapes of the transmission parts Ta of the first and the second photomasks 40a and 40b in the subregion AB1.

In an exemplary embodiment, in the second subregion AB2, each transmission part Ta of the first and the second photomasks 40a and 40b has the same shape as the transmission part Ta illustrated in FIG. 19, and the transmission parts Ta of the first and the second photomasks 40a and 40b are alternately arranged in the first direction Da.

Referring to FIG. 18, the irradiation amount of light Edr to the lower and upper panels 100 and 200 through the transmission part Ta of the first and the second photomasks 40*a* and 40*b* is uniformly distributed in each of the first, second and overlapping regions A, B, and AB. Since the total combined area of the transmission part Ta of the first and the second photomasks 40*a* and 40*b* is substantially the same as or greater than the transmission part Ta of the first and the second regions A and B, the irradiation amount of light of the irradiation region corresponding to the transmission part Ta in the overlapping region AB may be the same as or greater than the irradiation amount of light in the first and the second regions A and B.

Figure 24:
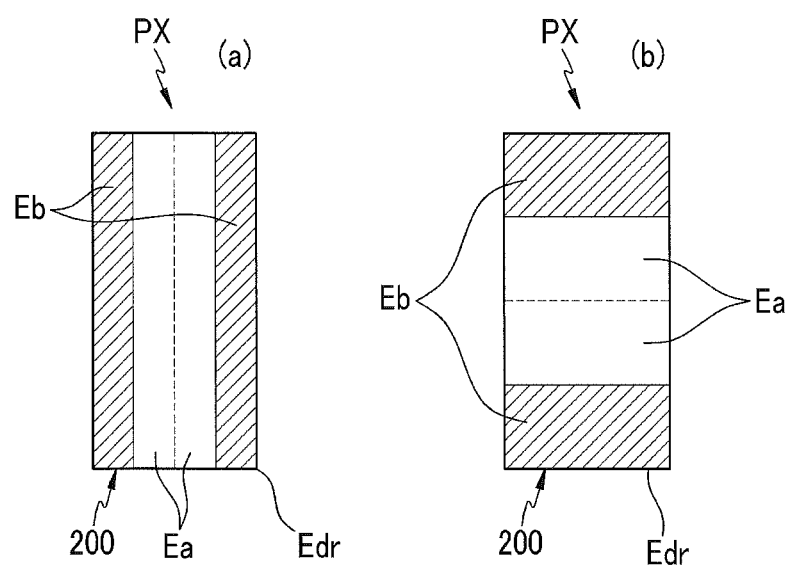
FIG. 24 is a block diagram illustrating an irradiation amount of light to a unit pixel of the liquid crystal display when an exposure is performed using the photomask illustrated in FIGS. 18, 20 and 22.

Referring to FIGS. 23 and 24, the irradiation amount of light Edr includes a high irradiation amount Ea and a low irradiation amount Eb based on the shape of the transmission part Ta. In one exemplary embodiment, for example, where the transmission part Ta is divided into left and right parts and an area of the left part is greater than an area of the right part as shown in FIG. 19, a portion corresponding to the left part of the transmission part Ta has the high irradiation amount Ea, and a portion corresponding to the right part of the transmission part Ta has the low irradiation amount Eb as shown in FIG. 23. In FIG. 23, the low irradiation amount Eb of the less irradiation amount is represented by a grey color.

Accordingly, in a method for photo-aligning a unit pixel PX to include a plurality of domains, the irradiation amount Edr corresponding to the unit pixel PX may include the high irradiation amount Ea and the low irradiation amount Eb as illustrated in FIGS. 24A and 24B. In an alternative exemplary embodiment, a region corresponding to the high irradiation amount Ea and a region corresponding to the low irradiation amount Eb shown in FIG. 24 may be switched.

In an exemplary embodiment, the pretilt angle of the liquid crystal molecule 31 may be varied and the distribution of the pretilt angle of the liquid crystal molecule 31 may be optimized, by controlling the irradiation amount of light to be different in different regions in a unit pixel PX.

Referring now to FIGS. 20 and 21, the first and the second photomasks 40*a* and 40*b* of the illustrated exemplary embodiment are substantially the same as the exemplary embodiment illustrated in FIG. 18 except the shapes of the transmission parts Ta of the first and the second photomasks 40*a* and 40*b* in the overlapping region AB.

Referring to FIG. 21, the entire shape of the transmission part Ta is substantially the same as the shape of the transmission part Ta shown in FIG. 19, but the transmission part Ta may be divided into a lower part Ta3 and an upper part Ta4.

In the first subregion AB1 of the overlapping region AB, the transmission part Ta of the first photomask 40*a* includes only the upper part Ta4, and the transmission part Ta of the second photomask 40*b* includes the lower part Ta3. The shape of the transmission part Ta in the third subregion AB3 is opposite to the shape of the transmission part Ta in the first subregion AB1.

In the second subregion AB2, the transmission parts Ta of the first and the second photomasks 40*a* and 40*b* are substantially the same as the shape of the transmission part Ta illustrated in FIGS. 19 and 21 except that the irradiation regions corresponding to the transmission part Ta do not overlap each other, that is not linearly aligned, and are alternately arranged.

Referring to FIG. 22, the first and the second photomasks 40*a* and 40*b* of the illustrated exemplary embodiment are substantially the same as the exemplary embodiment illustrated in FIG. 18, except that there is no second subregion AB2 of the overlapping region AB. In such an embodiment, the overlapping region AB includes two subregions, and the shapes of the transmission parts Ta in the two subregions are opposite to each other. In the overlapping region AB, the irradiation regions of the corresponding transmission parts Ta of the first and the second photomasks 40*a* and 40*b* do not overlap each other, and the transmission part Ta has a shape different from the shape of the transmission part Ta of the first region A or the second region B.

In the exemplary embodiments illustrated in FIGS. 5 to 24, the total combined areas of the transmission parts Ta in the overlapping regions AB of the first and the second photomasks 40*c* and 40*d* are substantially the same as the areas of the transmission parts Ta of the first region A and the second region B, but the invention is not limited thereto. In an alternative exemplary embodiment, the length in the length direction or in the width direction of the transmission part Ta in the overlapping region AB of the first photomask 40*a* or the second photomask 40*b* may be increased within a range of about 100% to about 150% of the illustrated length. In exemplary embodiments shown in FIGS. 5 to 24, the length of the length side of the transmission part Ta is increased or decreased to a length less that the length of the length side of the transmission part Ta in the first region A or the second region B, but the invention is not limited to. In an alternative exemplary embodiment, the length of the length side of the transmission part Ta may be increased over the length of the length side of a transmission part Ta in the first region A or the second region B. In such an embodiment, the pretilt angle of the liquid crystal molecule 31 by the alignment strength of the alignment layers 11 and 21 in the irradiation region may not be substantially different from the pretilt angle in the exemplary embodiments illustrated in FIGS. 5 to 24.

Next, alternative exemplary embodiments of a photoalignment method and a photomask according to the invention will be described with reference to FIGS. 25 to 29.

Figure 25:
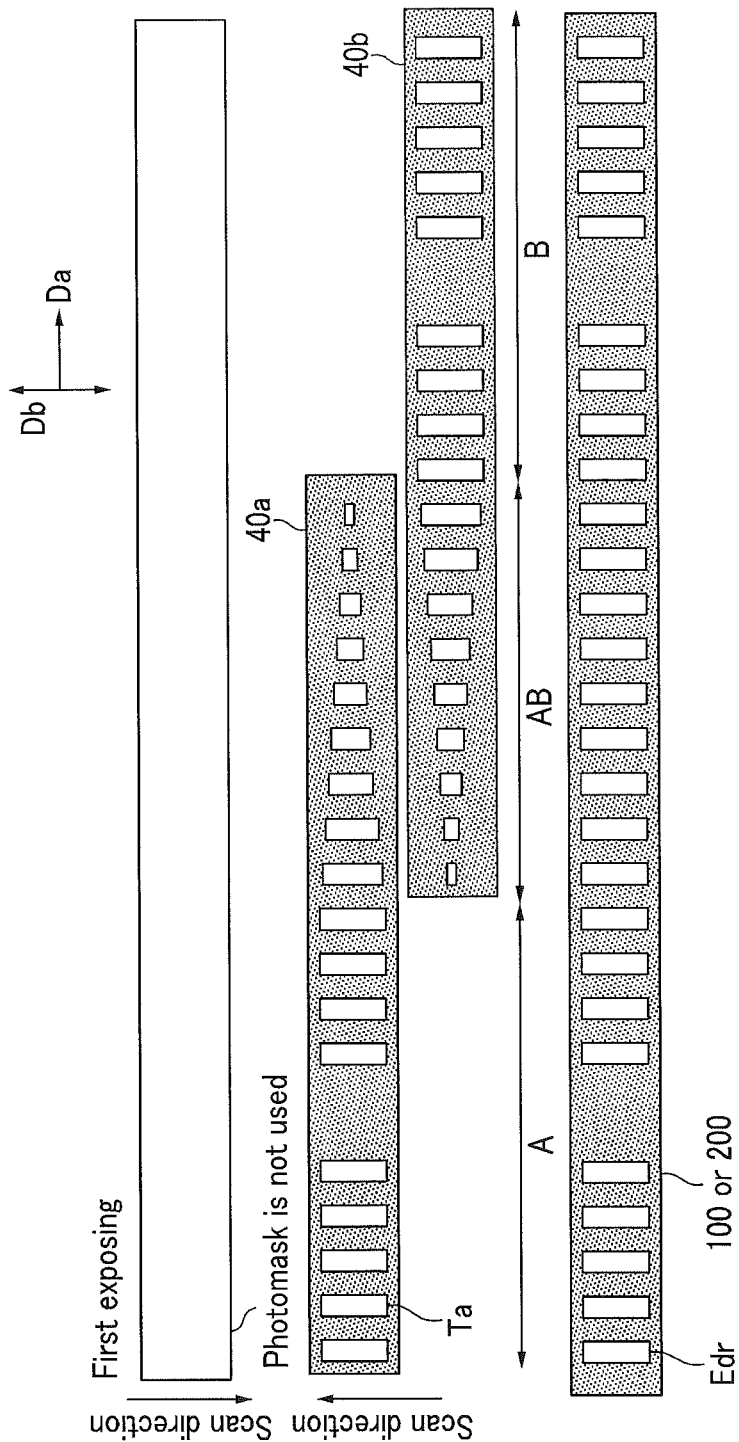
FIG. 25 is a top plan view of an exemplary embodiment of the photomask used in the photoalignment process according to the invention.
Figure 26:
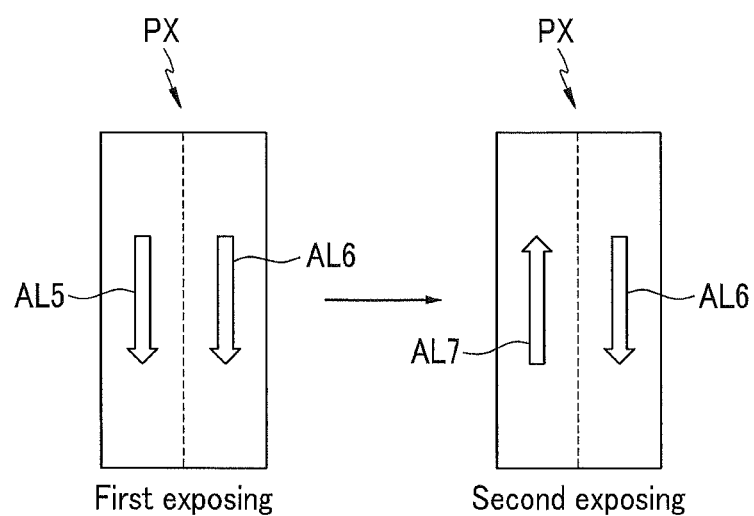
FIG. 26 is a block diagram illustrating an alignment direction of the alignment layer in a unit pixel when photoalignment is performed using the photomask illustrated in FIG. 25.
Figure 27:
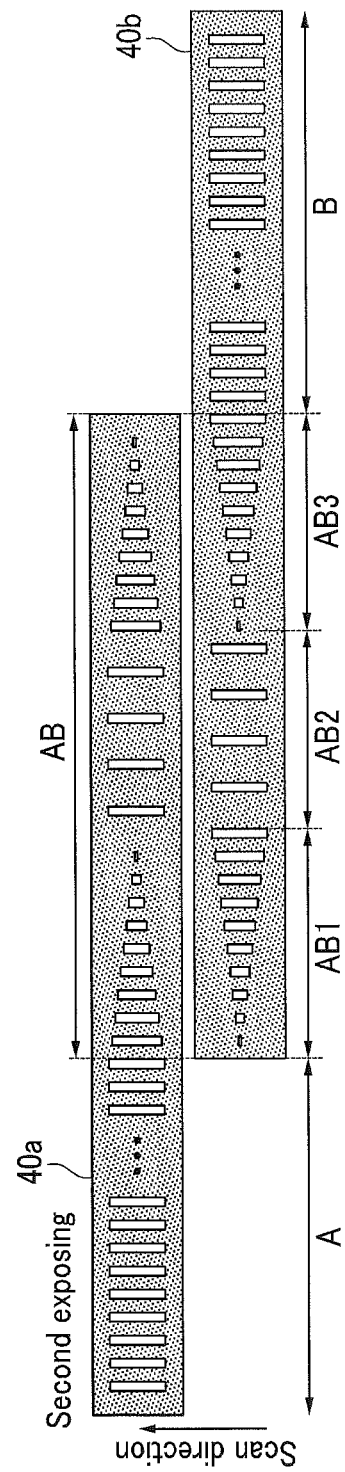
FIGS. 27 and 28 are top plan views illustrating alternative exemplary embodiments of a photomask used in a photoalignment process according to the invention.
Figure 28:
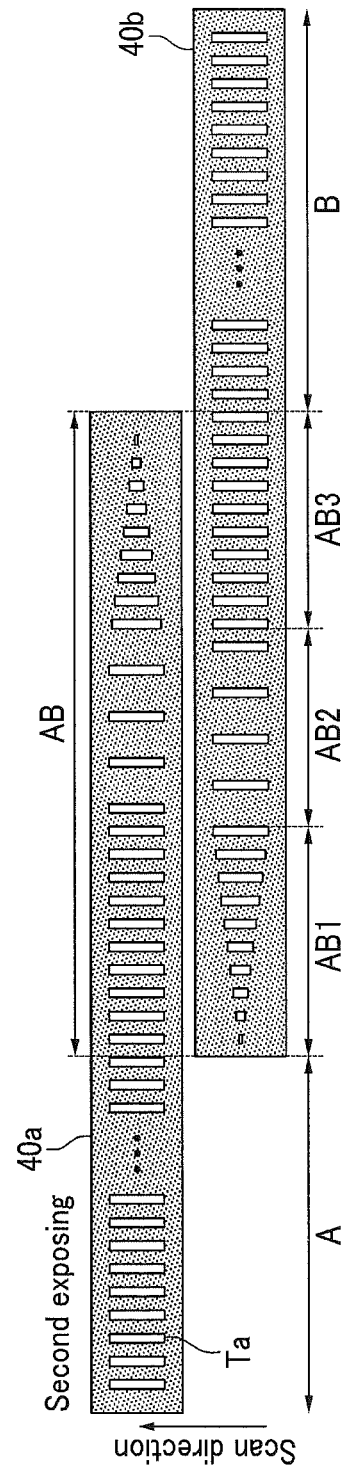
Figure 29:
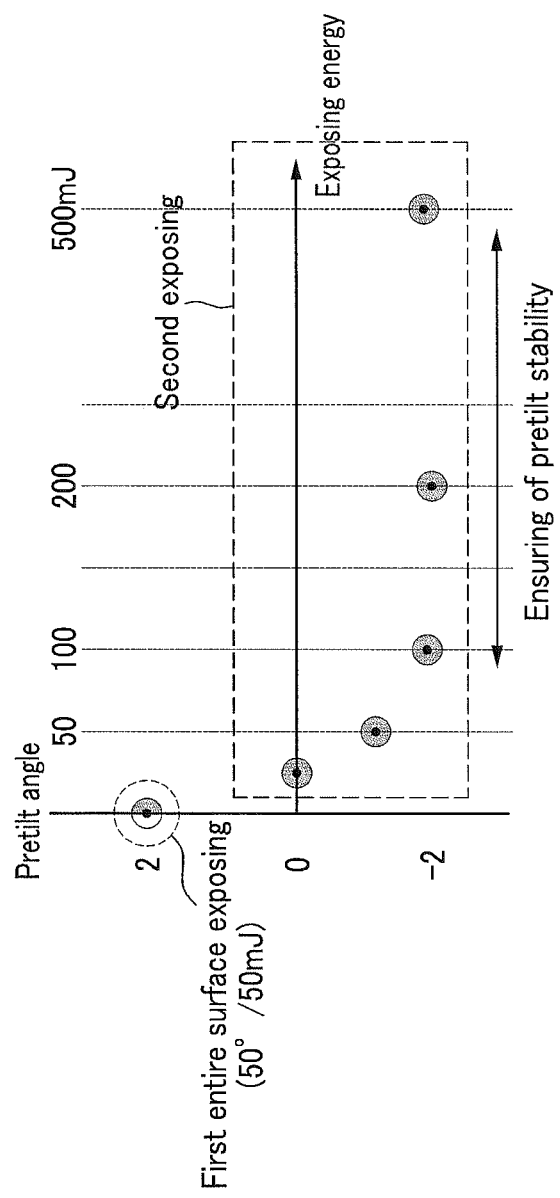
FIG. 29 is a graph illustrating pretilt angle of the liquid crystal molecule versus exposure energy in an exemplary embodiment of a photoalignment process according to the invention.

FIG. 25 is a top plan view of an exemplary embodiment of the photomask used in the photoalignment process according to the invention, FIG. 26 is a block diagram illustrating an alignment direction of the alignment layer in a unit pixel when photoalignment is performed using the photomask illustrated in FIG. 25, FIGS. 27 and 28 are views that illustrate a photomask used in a photoalignment process according to the invention, and FIG. 29 is a graph illustrating pretilt angle of the liquid crystal molecule versus exposure energy in an exemplary embodiment of a photoalignment process according to the invention.

Referring to FIG. 25, in an exemplary embodiment, a first exposure is substantially performed while the lower and upper panels 100 and 200 are scanned in the second direction Db without the photomask. In such an embodiment, irradiation direction of light or inclination direction of light may be substantially the same as the scanning direction of the first exposure.

In an exemplary embodiment, a second exposure is performed by scanning the lower and upper panels 100 and 200 in a direction opposite to the scanning direction of the first exposure using the first and the second photomasks 40*a* and 40*b* that partially overlap each other. In such an embodiment, irradiation direction of light or inclination direction of light may be substantially the same as the scanning direction of the second exposure, and the irradiation directions of light in the first and the second exposures are opposite to each other.

In an exemplary embodiment, as shown in FIG. 26, fifth and sixth alignment directions AL5 and AL6 of the entire unit pixel PX in the first exposure are substantially the same as each other. When light is blocked at the right part of the unit pixel PX by the second exposure using the photomasks 40*a* and 40*b* and light is irradiated in the opposite direction to the first exposure at the left part, the unit pixel PX may have different sixth and seventh alignment directions AL6 and AL7, such that the unit pixel may have a plurality of domains, in which alignment directions of the liquid crystal molecule 31 are different from each other. In an exemplary embodiment, the alignment strength of the seventh alignment direction AL7 is controlled such that the irradiation amount of the second exposure is greater than the irradiation amount of the first exposure.

Referring again to FIG. 25, the first and the second photomasks 40a and 40b used in the second exposure process obliquely irradiate light while scanning the lower and upper panels 100 and 200 in the second direction Db. In such an embodiment, portions of the first and the second photomasks 40a and 40b overlap each other, and the portions scan the same region on the lower and upper panels 100 and 200.

The transmission parts Ta of the first region A and the second region B of the first photomask 40a and the second photomask 40b, which do not overlap each other, are substantially the same as the exemplary embodiment illustrated in FIG. 5. The transmission parts Ta of the first region A and the second region B are arranged at a constant interval in the first direction Da.

In the overlapping region AB of the second photomask 40b in the first photomask 40a, the length of the transmission part Ta in the second direction Db is gradually decreased or increased from left to right. In such an embodiment, the length side of a transmission part Ta in the overlapping region AB of the first photomask 40a is gradually decreased from left to right in the first direction Da starting at the length of the length side of a transmission part Ta in the first region A. The length side of a transmission part Ta in the overlapping region AB of the second photomask 40b is gradually increased from left to right in the first direction Da toward the end of the overlapping region AB, the length of the length side becomes substantially equal to the length of the length side of the transmission part Ta in the second region B. In the overlapping region AB, the irradiation regions of the transmission parts Ta of the first photomask 40a and the second photomask 40b overlap each other, and the total combined area of the transmission part Ta of the first photomask 40a and the area of the transmission part Ta of the second photomask 40b that correspond to each other may be substantially the same as the area of the transmission part Ta of the first region A or the second region B. In such an embodiment, the irradiation amount of light Edr to the lower and upper panels 100 and 200 through the first and the second photomasks 40a and 40b may be substantially uniform throughout the entire region, e.g., the first, second and overlapping regions A, B and AB, as illustrated in FIG. 25.

In an alternative exemplary embodiment, the total combined area of the transmission part Ta in the overlapping region AB of the first photomask 40a and the second photomask 40b that correspond to each other may be greater than the area of the transmission part Ta of the first region A or the second region B. In such an embodiment, the total combined area of the transmission part Ta in the overlapping region AB of the first photomask 40a and the area of the transmission part Ta of the second photomask 40b that correspond to each other may be about in a range of 100% to about 150% of the area of the transmission part Ta of the first region A or the second region B, but the invention is not limited thereto.

Other characteristics are substantially the same as the exemplary embodiment illustrated in FIG. 5.

FIGS. 27 and 28 are top plan views illustrating alternative exemplary embodiments of a photomask used in a second exposure process of a photoalignment process according to the invention. The exemplary embodiment of the first and the second photomasks 40a and 40b illustrated in FIG. 27 are substantially the same as the exemplary embodiment illustrated in FIG. 25 except the structures of the overlapping region AB. The overlapping region AB is substantially the same as the exemplary embodiment illustrated in FIG. 13, and any repetitive detailed description thereof will be omitted.

The exemplary embodiment of the first and the second photomasks 40a and 40b illustrated in FIG. 28 is substantially the same as the first region A and the second region B of the first and the second photomasks 40a and 40b of the exemplary embodiment illustrated in FIG. 27 except the overlapping region AB of the first and the second photomasks 40a and 40b, which includes two or more subregions in which pattern shapes of the transmission part Ta are different from each other. As shown in FIG. 28, the overlapping region AB includes three subregions.

In the first subregion AB1, the transmission part Ta of the first photomask 40a has the same shape and arrangement as the transmission part Ta in the first region A, but the length of the length side of the transmission part Ta of the second photomask 40b is gradually increased as the transmission part goes in the first direction Da. In the first subregion AB1, since the transmission parts Ta of the first and the second photomasks 40a and 40b overlap each other or aligned, an exposure region of the lower and upper panels 100 and 200 corresponding to the first subregion AB1 is irradiated with light in a greater amount as compared to an exposure region of the lower and upper panels 100 and 200 corresponding to the first region A or the second region B. In such an embodiment, the pretilt angle of the liquid crystal molecule 31 in the irradiation region corresponding to the transmission part Ta of the first region A may be substantially the same as the pretilt of the liquid crystal molecule 31 in the irradiation region corresponding to the transmission part Ta of the first subregion AB1.

The pretilt angle of the liquid crystal molecule 31 in the irradiation region will be described in greater detail with reference to FIG. 29. In FIG. 29, the pretilt angle of the liquid crystal molecule 31 is an angle on the basis of the tangent line of the surfaces of the lower and upper panels 100 and 200. In the first exposing, the pretilt angle of the liquid crystal molecule 31 is approximately 2°, but the pretilt angle of the liquid crystal molecule 31 after the second exposure using the first and the second photomasks 40a and 40b maintains a constant pretilt angle almost regardless of exposure energy.

Referring to FIG. 28, the arrangements of the transmission parts Ta in the third subregion AB3 of the first and the second photomasks 40a and 40b are opposite to the arrangements of the transmission parts Ta in the first subregion AB1.

The second subregion AB2 of the illustrated exemplary embodiment is substantially the same as the second subregion AB2 of the exemplary embodiment shown in FIG. 27, and any repetitive detailed description thereof will be omitted.

In an exemplary embodiment, the photoalignment process is performed using various exemplary embodiment of the first and the second photomasks 40a and 40b, and a manufacturing cost of the photomask and the boundary line between the exposure regions of the different photomasks are thereby decreased, and an arrangement margin of the photomask is thereby increased.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An exposure apparatus for a photoalignment process, the exposure apparatus comprising:
   a first photomask including a plurality of transmission parts; and
   a second photomask including a plurality of transmission parts,
   wherein the first photomask and the second photomask partially overlap each other such that each of the first photomask and the second photomask includes an overlapping region and a non-overlapping region,
   the overlapping region of at least one of the first photomask and the second photomask includes at least two subregions, and
   shapes or arrangements of the transmission parts in the subregions of the overlapping region are different from each other.

2. The apparatus of claim 1, wherein
   the at least two subregions include at least one first subregion and at least one second subregion,
   an irradiation region corresponding to the transmission parts in the at least one first subregion of the first photomask and an irradiation region corresponding to the transmission parts in the at least one first subregion of the second photomask overlap each other, and
   irradiation regions corresponding to the transmission parts in the at least one second subregion of the first photomask and irradiation regions corresponding to the transmission parts in the at least one second subregion of the second photomask do not overlap each other.

3. The apparatus of claim 2, wherein
   the at least one first subregion and the at least one second subregion are alternately arranged.

4. The apparatus of claim 3, wherein
   a sum of an area of one transmission part in the at least one first subregion of the first photomask and an area of one transmission part in the at least one first subregion of the second photomask is substantially equal to or greater than an area of one transmission part in the non-overlapping region of the first photomask or the second photomask.

5. The apparatus of claim 4, wherein
   the sum of the area of the one transmission part in the at least one first subregion of the first photomask and the area of the one transmission part in the at least one first subregion of the second photomask is about 100% to about 150% of the area of the one transmission part in the non-overlapping region of the first photomask.

6. The apparatus of claim 5, wherein
   the transmission parts of the first photomask are arranged in a first direction, and
   a length of the transmission parts in the at least one first subregion of the first photomask or the second photomask in a second direction, which is substantially perpendicular to the first direction, is gradually changed along to the first direction.

7. The apparatus of claim 6, wherein
   the transmission parts in the at least one second subregion of the first photomask and the transmission parts in the at least one second subregion of the second photomask are alternately arranged in the first direction.

8. The apparatus of claim 2, wherein
   a sum of an areas of one transmission part in the at least one first subregion of the first photomask and an area of one transmission part in the at least one first subregion of the second photomask is substantially equal to or greater than an area of one transmission part of in the non-overlapping region of the first photomask.

9. The apparatus of claim 8, wherein
   the sum of the area of the one transmission part in the at least one first subregion of the first photomask and the area of the one transmission part in the at least one first subregion of the second photomask is about 100% to about 150% of the area of the one transmission part in the non-overlapping region of the first photomask.

10. The apparatus of claim 2, wherein
    the transmission parts of the first photomask are arranged in a first direction, and
    a length of the transmission parts in the at least one first subregion of the first photomask or the second photomask in a second direction, which is substantially perpendicular to the first direction, is gradually changed along the first direction.

11. The apparatus of claim 2, wherein
    the transmission parts in the at least one second subregion of the first photomask and the transmission parts in the at least one second subregion of the second photomask are alternately arranged in the first direction.

12. The apparatus of claim 1, further comprising:
    a first light source which provides light to the first photomask; and
    a second light source which provides light to the second photomask.

13. The apparatus of claim 12, wherein
    the first light source and the second light source irradiate the light obliquely through the first photomask and the second photomask, respectively.

14. An exposure apparatus for a photo alignment process, the exposure apparatus comprising:
    a first photomask including a plurality of transmission parts; and
    a second photomask including a plurality of transmission parts,
    wherein the first photomask and the second photomask partially overlap each other such that each of the first photomask and the second photomask includes an overlapping region and a non-overlapping region,
    each of the first photomask and the second photomask include a first portion and a second portion, and irradiation regions corresponding to the first portion are different from irradiation regions corresponding to the second portion,
    an irradiation direction of lights passing through a transmission part in the first portion is different from an irradiation direction of lights passing through a transmission part in the second portion, and
    a shape or an arrangement of the transmission parts in the overlapping region of the first photomask or the second photomask is different from a shape or an arrangement of the transmission parts in the non-overlapping region of the first photomask or the second photomask.

15. The apparatus of claim 14, wherein
    an irradiation region corresponding to one transmission part in the overlapping region of the first photomask and an irradiation region corresponding to one transmission part in the overlapping region of the second photomask overlap each other.

16. The apparatus of claim 14, wherein
    an irradiation region corresponding to one transmission part in the overlapping region of the first photomask and an irradiation region corresponding to one transmission part in the overlapping region of the second photomask do not overlap.

17. The apparatus of claim 14, wherein
the overlapping region of at least one of the first photomask and the second photomask includes at least two subregions, and
shapes or arrangements of the transmission parts in the at least two subregions are different from each other.

18. An exposure apparatus for a photoalignment process, the exposure apparatus comprising:
a first photomask including a plurality of transmission parts arranged in a first direction; and
a second photomask including a plurality of transmission parts arranged in the first direction,
wherein the first photomask and the second photomask partially overlap each other such that each of the first photomask and the second photomask includes an overlapping region and a non-overlapping region,
a transmission part of at least one of the first photomask and the second photomask has a shape that is asymmetric in a direction parallel to the first direction, and
a shape or an arrangement of the transmission parts in the overlapping region of the first photomask or the second photomask is different a shape or an arrangement of the transmission parts in the non-overlapping region of the first photomask or the second photomask.

19. The apparatus of claim 18, wherein
irradiation regions corresponding to a portion of the transmission parts in the overlapping region of the first photomask and irradiation regions corresponding to a portion of the transmission parts in the overlapping region of the second photomask do not overlap.

20. The apparatus of claim 19, wherein
a combined shape of one transmission part in the overlapping region of the first photomask and one transmission part in the overlapping region of the second photomask is substantially identical to a shape of the transmission parts in the non-overlapping region of the first photomask or the second photomask.

21. The apparatus of claim 18, wherein
the overlapping region of at least one of the first photomask and the overlapping region of the second photomask includes at least two subregions, and
shapes or arrangements of the transmission parts in the at least two subregions are different from each other.

* * * * *